(12) United States Patent
Endo et al.

(10) Patent No.: US 7,612,425 B2
(45) Date of Patent: Nov. 3, 2009

(54) IMAGE SENSOR WITH A TRANSPARENT PLATE HAVING REFRACTIVE INDEX CHANGING REGIONS

(75) Inventors: Takafumi Endo, Tokyo (JP); Yohei Nokami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 7 days.

(21) Appl. No.: 11/550,163

(22) Filed: Oct. 17, 2006

(65) Prior Publication Data

US 2007/0252225 A1 Nov. 1, 2007

(30) Foreign Application Priority Data

Apr. 28, 2006 (JP) ............................... 2006-125208

(51) Int. Cl.
*H01L 27/14* (2006.01)
(52) U.S. Cl. ........................... 257/431; 257/59; 257/72; 257/222; 257/225; 257/232; 257/234; 257/436; 257/E31.097; 257/E27.13
(58) Field of Classification Search .................. None
See application file for complete search history.

(56) References Cited

U.S. PATENT DOCUMENTS

| | | | |
|---|---|---|---|
| 5,412,229 A * | 5/1995 | Kuhara et al. | 257/183 |
| 5,489,992 A | 2/1996 | Endo | |
| 5,617,252 A * | 4/1997 | Manhart et al. | 359/653 |
| 6,969,838 B2 | 11/2005 | Endo et al. | |
| 7,427,742 B2 * | 9/2008 | Drowley et al. | 250/216 |
| 2001/0040263 A1 * | 11/2001 | Nakai | 257/432 |

FOREIGN PATENT DOCUMENTS

| | | |
|---|---|---|
| JP | 59-127017 | 7/1984 |
| JP | 2-105773 | 4/1990 |
| JP | 3-44966 | 2/1991 |
| JP | 6-218985 | 8/1994 |
| JP | 7-115180 | 5/1995 |
| JP | 2003-101724 | 4/2003 |
| JP | 2005-295095 | 10/2005 |

* cited by examiner

*Primary Examiner*—Minh-Loan T Tran
*Assistant Examiner*—Fei Fei Yeung Lopez
(74) *Attorney, Agent, or Firm*—Oblon, Spivak, McClelland, Maier & Neustadt, L.L.P.

(57) ABSTRACT

An image sensor includes: a light source that irradiates a light on an object; a lens body that converges a reflection of the light from the object; a plurality of IC chips that receive the reflection passed through the lens body; and a transparent member provided between the IC chips and the lens body. The transparent member includes a refractive index changing region provided at a portion opposite to a gap between adjacent IC chips. A refractive index in the refractive index changing region increases continuously or stepwise toward an inner portion of the transparent member from a surface of the transparent member on an IC chips side so that the refractive index changing region refracts a part of the reflection to be incident into the gap to the IC chips.

5 Claims, 21 Drawing Sheets

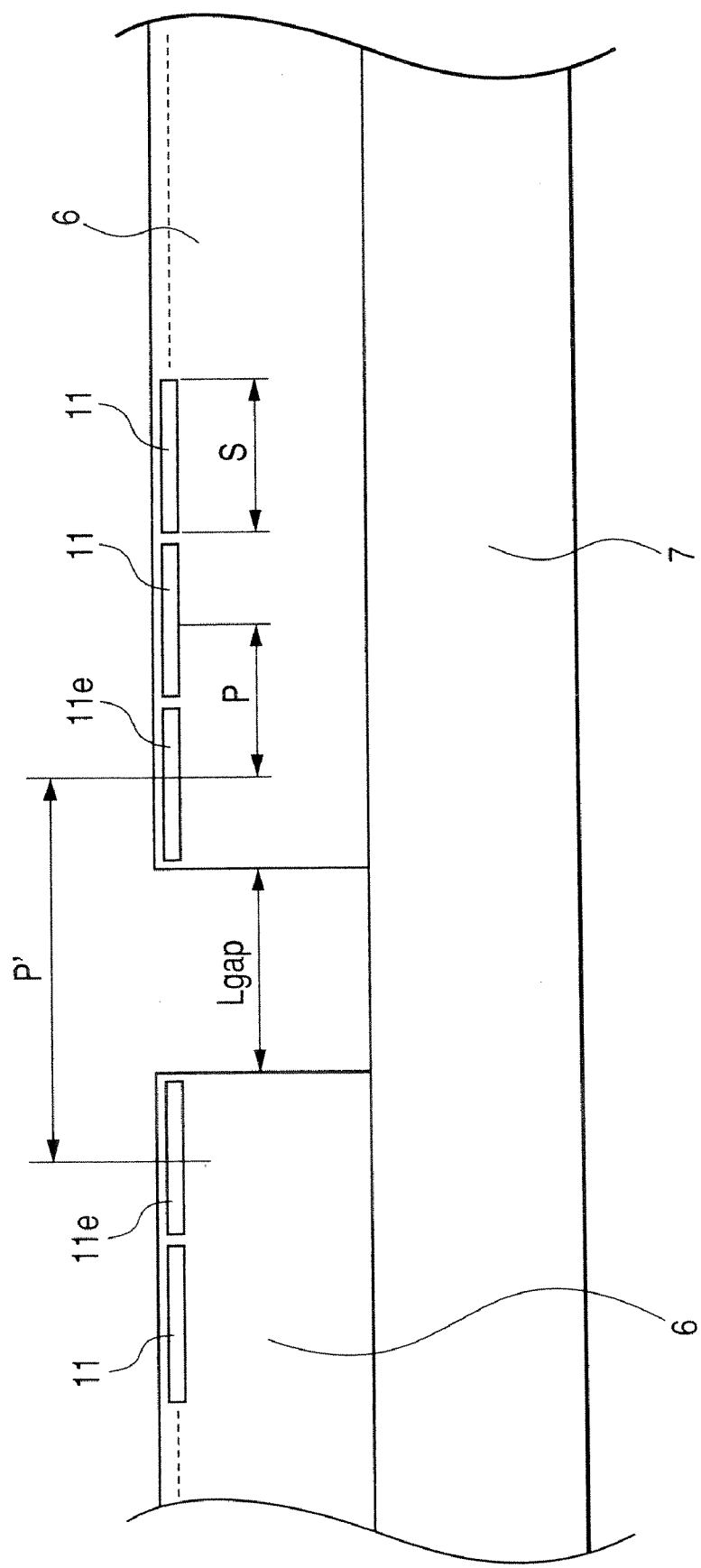

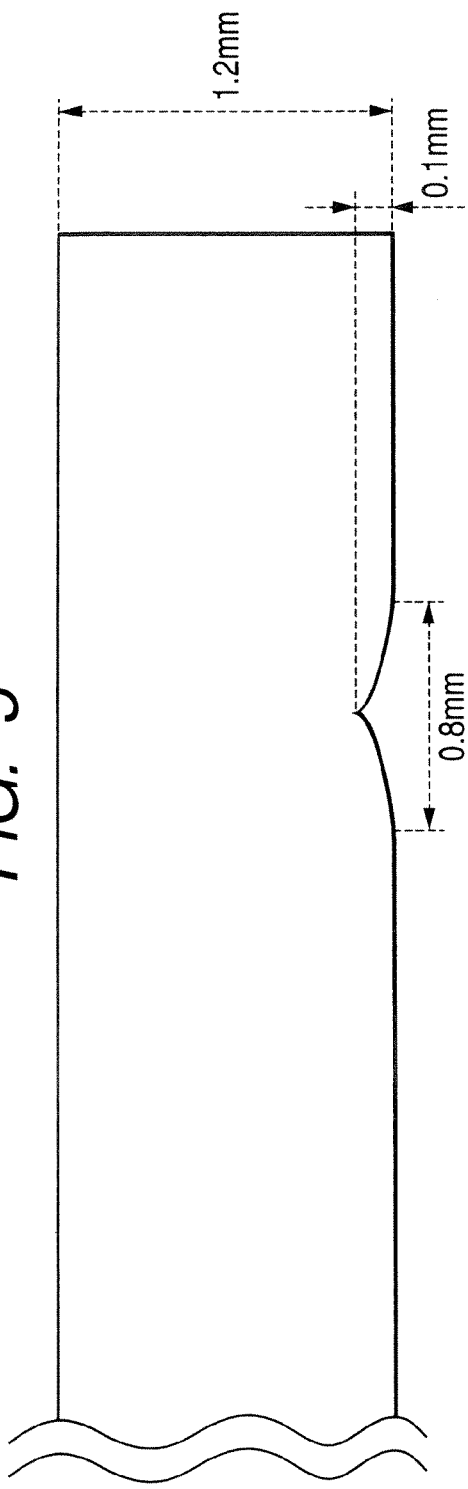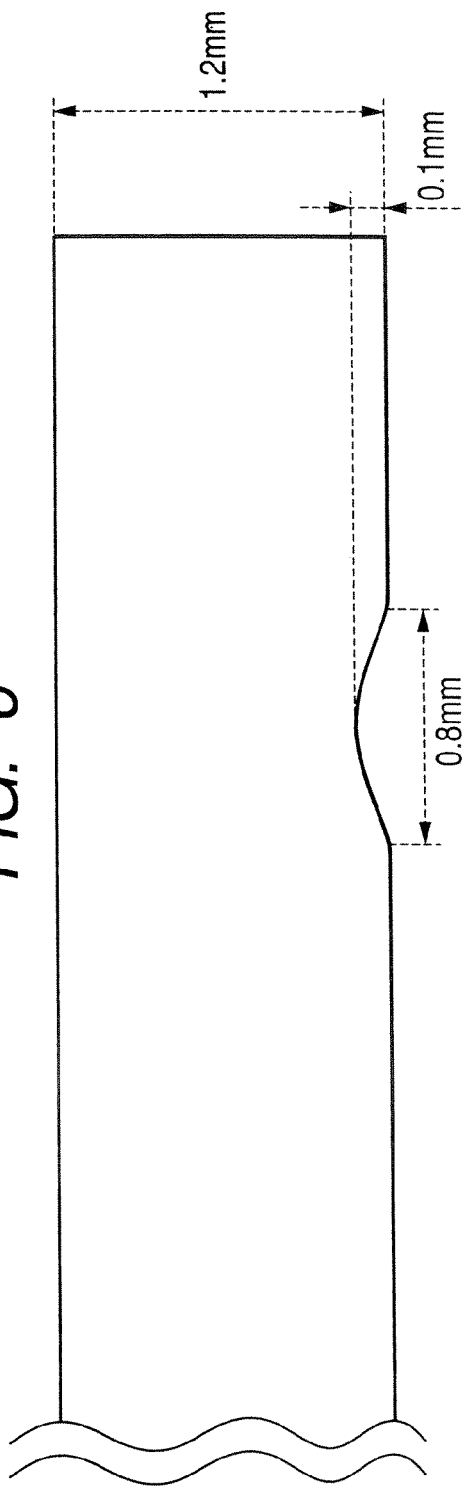

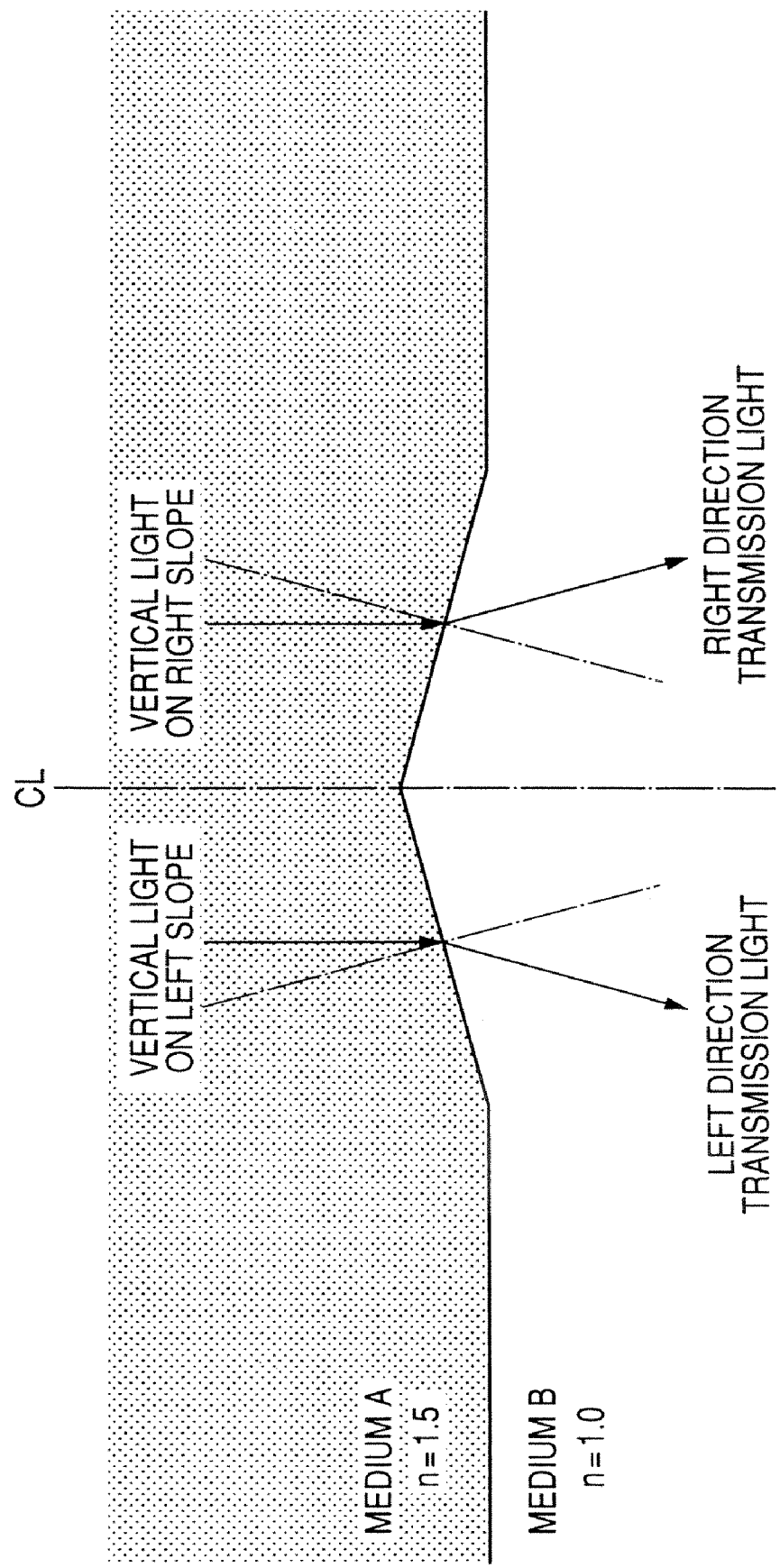

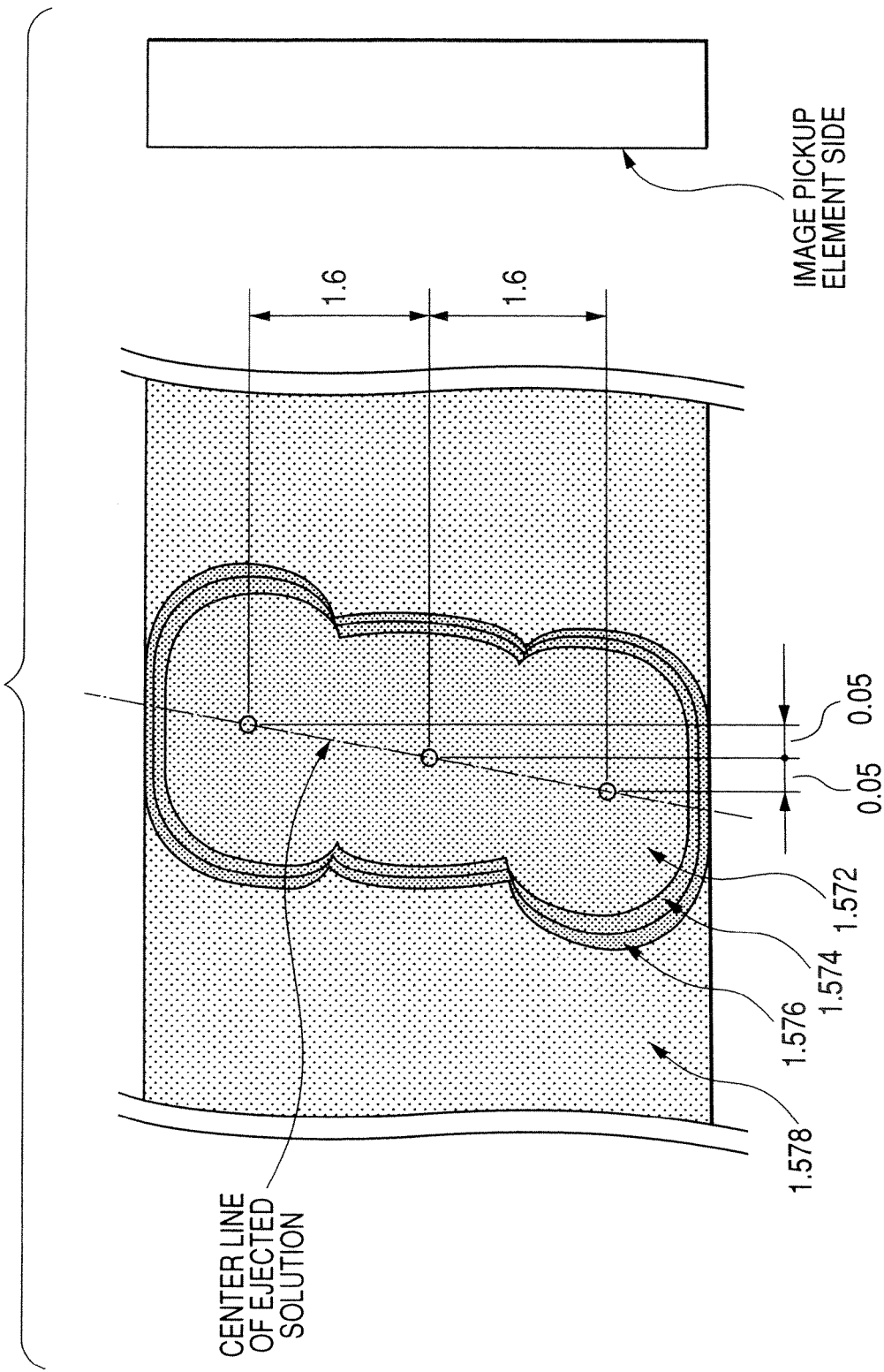

IMAGE SENSOR WITH A TRANSPARENT PLATE HAVING REFRACTIVE INDEX CHANGING REGIONS

BACKGROUND OF THE INVENTION

1. Field of the Invention

The present invention relates to an image sensor used for an image input device and in particular, to a contact type image sensor in which a plurality of semiconductor chips are mounted as a photoelectric conversion element and also to a manufacturing method thereof.

2. Description of the Related Art

As one configuration of a linear image sensor of a multi-chip type in which a plurality of semiconductor chips each formed by arranging many photoelectric conversion elements (image pick-up elements) with a constant interval therebetween are arranged linearly, FIGS. 5 and 6 of JP-A-2005-295095 discloses the configuration in which, in order to interpolate a state (also called as an imaginary image pickup element) that there is no image pickup element at a gap region between the adjacent semiconductor chips, a transparent plate having a refraction function is provided at an optical path region corresponding to the boundary area of the semiconductor chips thereby to incident light dividedly to the image pickup elements of the adjacent semiconductor chips.

An image reading device is disclosed in FIG. 9 of a JP-A-2003-101724, in which a plurality of chips are arranged so as to prevent a density difference caused by a pitch error between the chips (at a boundary of the chips) from becoming conspicuous. In the drawing, reference symbols C1 and C2 denote chips (photoelectric conversion elements), Ca and Cb denote chip ends adjacent to each other, La denotes a gap distance between the ends of adjacent chips. Further, a reference symbol r denotes an image pickup element (light receiving element), P denotes a distance between the image pickup elements, P' denotes a distance between boundary image pickup elements. Still further, in FIG. 3(c) of JP-A-2003-101724, reference symbols C14 and C21 are image pickup elements located at the boundary of the chips adjacent to each other.

Moreover, FIG. 4 of JP-A-6-218985 discloses an image reading device in which a plurality of optical element chips are arranged. In the drawing, a reference symbol 1 denotes an optical element chip, 2 denotes an element (light receiving element), 3 denotes an (inclined) end surface in a longitudinal direction, 3a denotes an edge on the main surface side of the chip 1, 3b denotes an edge on the rear surface side (substrate side) of the chip 1, 7 denotes a substrate, and 8 denotes silver paste.

SUMMARY OF THE INVENTION

However, according to JP-A-2005-295095, since the notched shape of the transparent plate 5 is configured by the combination of an arc shape and a rectangular shape, a discontinuity appears at the contact points between the arc shape and the rectangular shape. Thus, although this configuration is effective as to a vertical light, as to light with an incident angle slightly inclined with respect to the vertical light, a plane formed by the transfer direction of an object to be picked image up and the transmission direction of light becomes a discontinuous plane with respect to the reading width direction. A part of the incident light reflects fully on the discontinuous surface, so that there arises a problem that this fully reflected light results in a stray light (unnecessary light) and so a reading image is degraded.

In the device of JP-A-2003-101724, the distance P' between the boundary image pickup elements become longer with respect to the distance P between the image pickup elements and hence an average value of the output of the image pickup element C14 and the output of the image pickup element C21 is added as interpolation data. In this case, since the interpolation data is not actual image data which is read by the image sensor, it is difficult to apply this technique to an object to be picked image up such as a paper money. Further, since the imaginary image pickup element is interpolated as image data to increase the number of the image pickup element irregularly, the number of the elements of the image sensors differs from the bit number of the linear image processing, so that there arises a problem that a signal processing circuit is complicated.

In the device of JP-A-6-218985, the rigidity of a rotating blade is enhanced and dicing is performed while inclining the rotating blade and the edge 3a on the main surface side of chip 1 is made protruded to retract the edge 3b on the rear surface side, so that the distance P' between the boundary image pickup elements can be brought close to the actual distance P between the image pickup elements on the same chip.

However, at a time of actual production with automatic mounting by a die bonder or the like, the chips need to be previously separated and then mounted in consideration of the collision (contact) of chips caused by a mounting accuracy. Moreover, even if the chips can be mounted with high accuracy in themselves, the chips are mechanically mounted on an adhesive such as the silver paste 8 located below, so that the chips might be changed in positions after the chips are mounted.

Further, at the time of bonding the chips, the adhesive is thermally cured to fix the chips. Hence, there is presented a problem that in the case of arranging many chips, after all, there also arises a problem that the chips can not be mounted with high accuracy because the position changes of chips caused by the random movement of chips due to the shrinkage of adhesive at the time of curing, can not be neglected.

An image sensor according to the invention solves the problems described above and an object of the invention is to provide an image sensor that can reduce the degree of the degradation of a read image caused by the stray light and also can read an image in a boundary region of chips with high fidelity without using interpolation data (data by an imaginary image pickup element) even if a distance P' between boundary image pickup elements is larger than a distance P between image pickup elements on the same chip, and to provide a manufacturing method of the image sensor.

According to a first aspect of the invention, there is provided an image sensor including: a light source that irradiates a light on an object; a lens body that converges a reflection of the light from the object; a plurality of IC chips that receive the reflection passed through the lens body; and a transparent member provided between the IC chips and the lens body. The transparent member includes a refractive index changing region provided at a portion opposite to a gap between adjacent IC chips. A refractive index in the refractive index changing region increases continuously or stepwise toward an inner portion of the transparent member from a surface of the transparent member on an IC chips side so that the refractive index changing region refracts a part of the reflection to be incident into the gap to the IC chips.

According to a second aspect of the invention, there is provided an image sensor including: a light source that irradiates a light on an object; a lens body that converges a reflection of the light from the object; a plurality of IC chips that receive the reflection passed through the lens body; and a transparent member provided between the IC chips and the lens body. A surface of the transparent member is formed with a groove on an IC chips side at a portion opposite to a gap between adjacent IC chips so that a part of the reflection incident to the groove is refracted toward the IC chips.

According to a third aspect of the invention, there is provided a method of manufacturing an image sensor. The method includes: providing a light source that irradiates a light on an object and a lens body that converges a reflection of the light from the object; arranging a plurality of IC chips along the lens body, the IC chips being configured to receive the reflection passed through the lens body; forming refractive index changing regions in a transparent member, each of the refractive index changing regions being configured such that a refractive index increases continuously or stepwise toward an inner portion of the transparent member from a surface of the transparent member, the refractive index changing regions being formed at a constant interval so as to be opposite to gaps between adjacent IC chips, respectively; and disposing the transparent member between the IC chips and the lens body so that each of the refractive index changing regions are opposite to each of the gaps between adjacent IC chips, respectively.

The forming of the refractive index changing regions may include: masking the transparent member by a metal mask member formed with a plurality of holes at the constant interval according to the gaps between the adjacent IC chips, respectively; and ejecting a solution containing ions exchangeable with ions within the transparent member to the transparent member through the holes to form the refractive index changing regions.

In the ejecting, the solution may be simultaneously ejected to the transparent member through the holes to form the refractive index changing regions.

The solution may be simultaneously ejected through the holes to the transparent member with a direction perpendicular to the surface of the transparent member and a direction slanted from the direction perpendicular to the surface of the transparent member.

The forming of the refractive index changing region may include: masking the transparent member by a metal mask member provided with a plurality of holes at the constant interval according to the gaps between the adjacent IC chips, respectively; and dipping the transparent member into a solution containing ions exchangeable with ions within the transparent member through the holes to form the refractive index changing regions.

The solution may include a sodium sulfide solution.

The transparent member may be masked by a plurality of the metal mask members and the transparent member may be dipped into the sodium sulfide solution together with the metal mask members.

The metal mask member may be wound by wires on an outer periphery thereof after attaching the transparent member.

According to a fourth aspect of the invention, there is provided a method of manufacturing an image sensor. The method comprising: disposing a light source that irradiates a light on an object and a lens body that converges a reflection of the light from the object; arranging a plurality of IC chips that receive the reflection passed through the lens body, along the lens body; forming a plurality of grooves on a surface of a transparent member at a constant interval according to gaps between adjacent IC chips; and disposing the transparent member between the IC chips and the lens body so that each of the grooves is opposite to each of the gaps between the adjacent IC chips.

According to a fifth aspect of the invention, there is provided an image sensor including: a light source that irradiates a light on an object; a lens body that converges a reflection of the light from the object; a plurality of IC chips that receives the reflection passed through the lens body, the IC chips being disposed along the lens body; a sensor substrate on which the IC chips is mounted; a transparent member that is disposed between the IC chips and the lens body and is formed with grooves on a surface of the transparent member at portions opposite to gaps between adjacent IC chips, respectively; and a plurality of thin film members provided on the sensor substrate at portions opposite to the grooves of the transparent member, respectively. One end portions of the adjacent IC chips are disposed on the thin film member so that an optical length of a part of the reflection passed through each of the grooves of the transparent member to reach the one end portions of the adjacent IC chips is substantially same as an optical length of another part of the reflection passed through a portion other than the grooves of the transparent member to reach the IC chips.

According to a sixth aspect of the invention, there is provided a method of manufacturing an image sensor. The method includes: disposing a light source that irradiates a light on an object and a lens body that converges a reflection of the light from the object; arranging a plurality of IC chips that receive the reflection passed through the lens body, on a sensor substrate; forming a plurality of grooves on a surface of a transparent member according to gaps between adjacent IC chips, respectively; supporting the transparent member between the lens body and the IC chips; forming solder resist patterns on the sensor substrate according to the grooves, respectively, and forming a die bond pattern so as to extend over the solder resist patterns; and disposing end portions of each of the adjacent IC chips on the die bond pattern of the solder resist pattern.

The refractive index changing region may include a plurality of refractive index changing regions formed in a direction perpendicular to a longitudinal direction of the transparent member and are formed so as to be shifted to each other in the longitudinal direction.

The grooves may include a plurality of grooves formed in a direction perpendicular to a longitudinal direction of the transparent member and are formed so as to be shifted to each other in the longitudinal direction.

As described above, according to the image sensor and the manufacturing method thereof according to the aspects, since the transparent member is mounted which is provided with a cutout portion that has the maximum depth at the center of the gap of the adjacent semiconductor chips and that depth reduces gradually in accordance with the distance away from the center of the gap, thereby to dividedly incident light incidenting into the gap regions of the adjacent semiconductor chips to the light receiving element side. Thus, a problem of the degradation of image caused by stray light can be lightened and it is not necessary to prepare data for the imaginary image pickup elements. Further, even when a distance between boundary image pickup elements is larger than a distance between image pickup elements on the same chip, an image at the gap regions (boundary regions) of the semiconductor chips can be read with high fidelity.

Further, the refractive index changing region is provided which has a predetermined refractive index at the deep portion corresponding to the center of the gap with respect to light incident into the gap of the adjacent semiconductor chips and which performs the ion exchange between univalent ion and heat melting salt and in which a refractive index reduces toward the surface portion of the transparent member in accordance with the distance away from the center of the gap. Thus, since light incident into the gap region of the adjacent semiconductor chips is dividedly incident on the light receiving element side, in addition to the technical effects obtained by the invention claimed in claim 1, the following effects can be obtained. That is, it is not necessary to physically process the transparent member and the region which refractive index changes continuously is provided by the chemical treatment. Thus, the light receiving element receives refraction light in which traveling direction of the incident light changes gradually, so that the degree of the variation of the steep bending of the refraction light at the gap region of the adjacent semiconductor chips is reduced, whereby light incident in the gap regions can be reproduced with high fidelity.

Further, when the chemical treatment time for exchanging ions within the transparent member with ions of the heat melting salt is changed, the refraction light of light incident into the gap region of the semiconductor chips can be freely bent on the desired light receiving element side advantageously.

Further, when a roll portion is provided so that the light receiving element located closer on the both end sides of the sensor chip is made closer to the transparent member side, it is possible to coincide conjugate lengths, whereby it is possible to maintain an image quality of high accuracy without causing any defocusing.

Furthermore, when the grooves of the transparent member or the refractive index changing regions are formed in the direction perpendicular to the longitudinal direction of the transparent member in a manner that these grooves or these regions are disposed so as to be shifted oppositely in the longitudinal direction to each other, this embodiment is largely effective in order to improve the average image quality at the imaginary image pickup regions as for the image sensor having large variations among the gap sizes of the elements.

BRIEF DESCRIPTION OF THE DRAWINGS

Embodiments of the present invention will be described in detail based on the following figures, wherein:

FIG. 4 is a diagram for explaining a positional relationship of semiconductor chips on the sensor substrate of the image sensor according to the first embodiment of the invention;

FIG. 5 is a partial side view for explaining a shape of the transparent plate according to the first embodiment of the invention;

FIG. 6 is a partial side view for explaining the shape of the transparent plate according to the first embodiment of the invention;

FIG. 7 is a diagram for explaining a refraction of light at a boundary of mediums;

FIG. 24 is a partial plan view of the transparent plate of the image sensor relating to the fourth embodiment of the invention.

DETAILED DESCRIPTION OF THE INVENTION

First Embodiment

Figure 1:
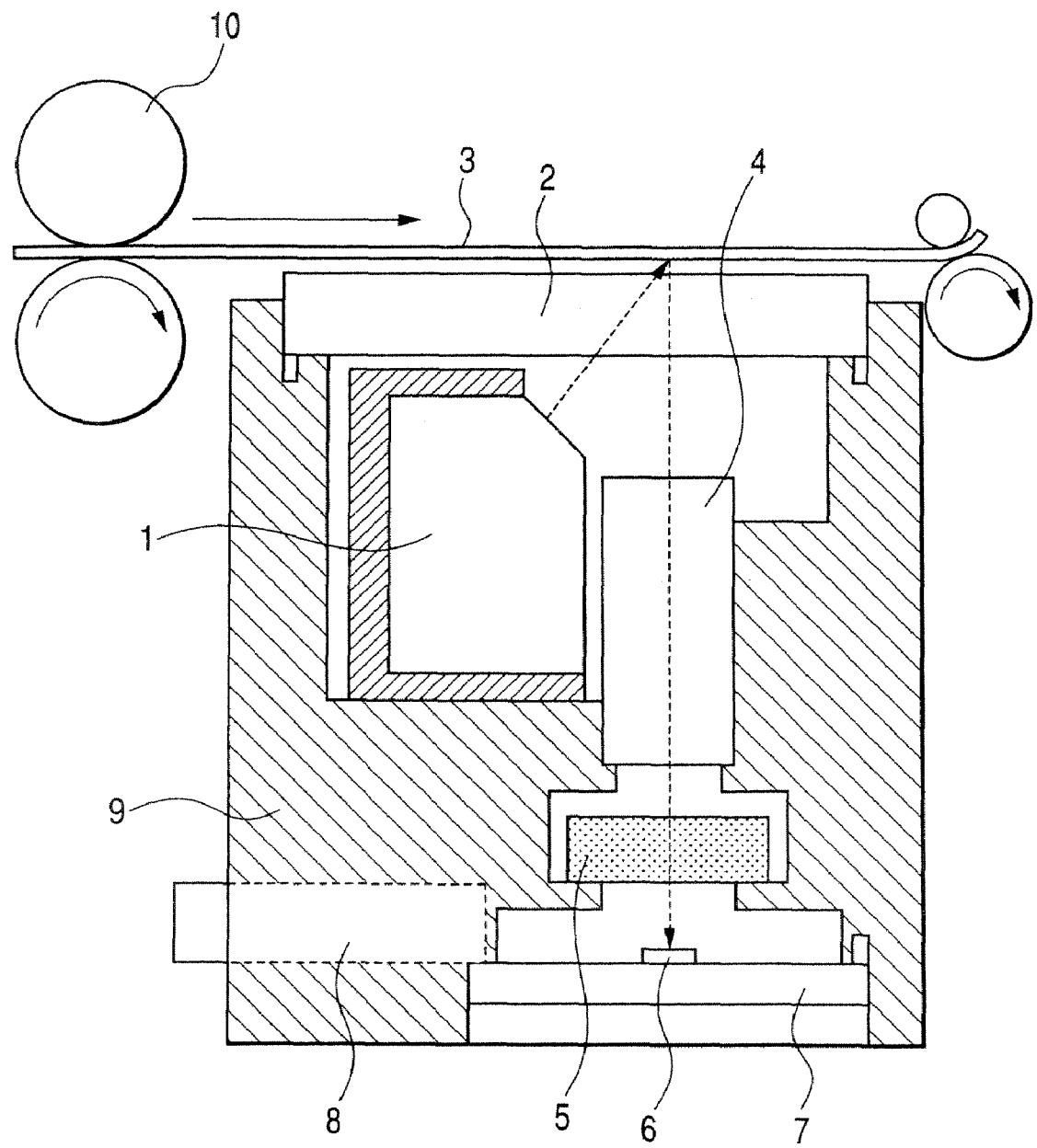
FIG. 1 is a sectional constitutional diagram showing an image sensor according to a first embodiment of the invention.

Hereafter, the first embodiment of the invention will be described. FIG. 1 is a sectional view showing the structure of an image sensor of the invention. In FIG. 1, a reference numeral 1 denotes a light source for applying light to an object to be picked image up (original document, paper money, check, marketable securities and the like), 2 denotes a glass plate for providing a running plane over which the object 3 to be picked image up runs or for protecting and hermetically closing the image sensor, 3 denotes an original document such as a paper money that is the object to be picked image up (object on which light is irradiated), 4 denotes a lens (rod lens array) for converging light reflected by the original document 3, 5 denotes a transparent plate (transparent member) for transmitting the reflected light converged by the rod lens array 4, 6 denotes an IC chip (sensor chip) composed of an image pickup element for converting light into an electric signal and a drive circuit of the image pickup element, 7 denotes a sensor substrate on which the sensor chip (also called as a semiconductor chip) 6 are mounted, and 8 denotes a connector for passing and receiving an input/output signal. A reference numeral 9 denotes a case for accommodating or holding the rod lens array 4, the transparent plate 5, and the sensor substrate 7, and 10 denotes a drive platen for driving the original document 3 and the drive platen is not usually mounted on the image sensor.

Next, operation will be described. In FIG. 1, light from the light source 1 is applied to the original document 3 via the glass plate 2. A part of light reflected and scattered by the original document 3 becomes reflected light and is converged by the rod lens array 4 via the glass plate 2. The reflected light converged by the rod lens array 4 transmits through the transparent plate 5 and incidents to the image pickup element (light receiving element) of the sensor chip 6 on the sensor substrate 7.

A distance between the surface of an original document and the image pickup element placed on the sensor chip 6 is called a light path length, and a part of light which is reflected and scattered and incident along this light path is received as reflected light by the sensor chip 6. The rod lens array 4, the transparent plate 5 and the part of image pickup element of the sensor chip 6 are arranged symmetrically with respect to a light path axis.

Figure 2:
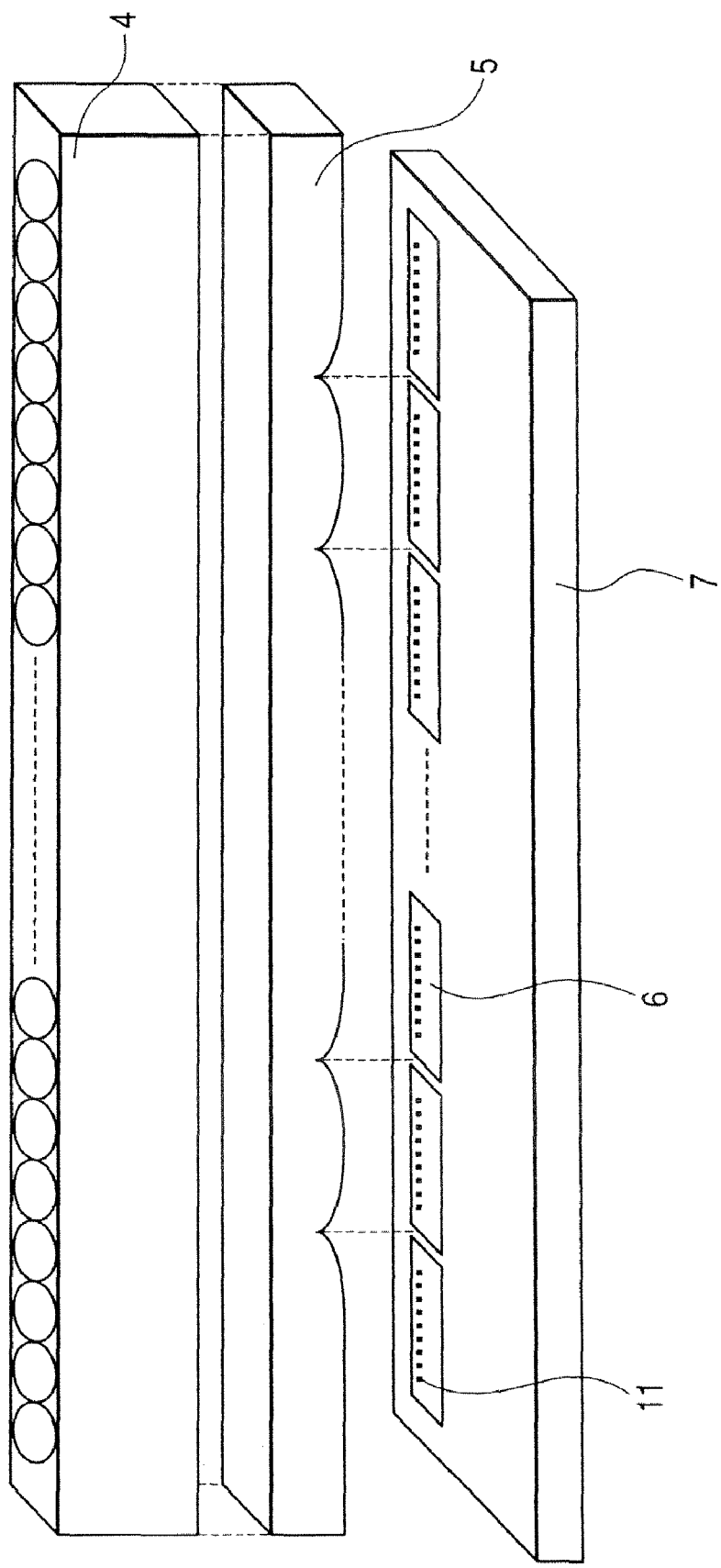
FIG. 2 is a diagram showing the positional relationship among a rod lens array, a transparent plate and a sensor substrate of the image sensor according to the first embodiment of the invention.

FIG. 2 is a perspective view (bird's eye view) to show the positional relationship among the rod lens array 4, the transparent plate 5, and the sensor chip 6 on the sensor substrate 7 and their shapes in a longitudinal direction (reading width direction of the original document). At this point, a reference numeral 11 denotes an image pickup element (light receiving element) which is formed on the semiconductor chip 6. In the drawing, portions identical to or corresponding to those of FIG. 1 are referred to by the common symbols.

Figure 3:
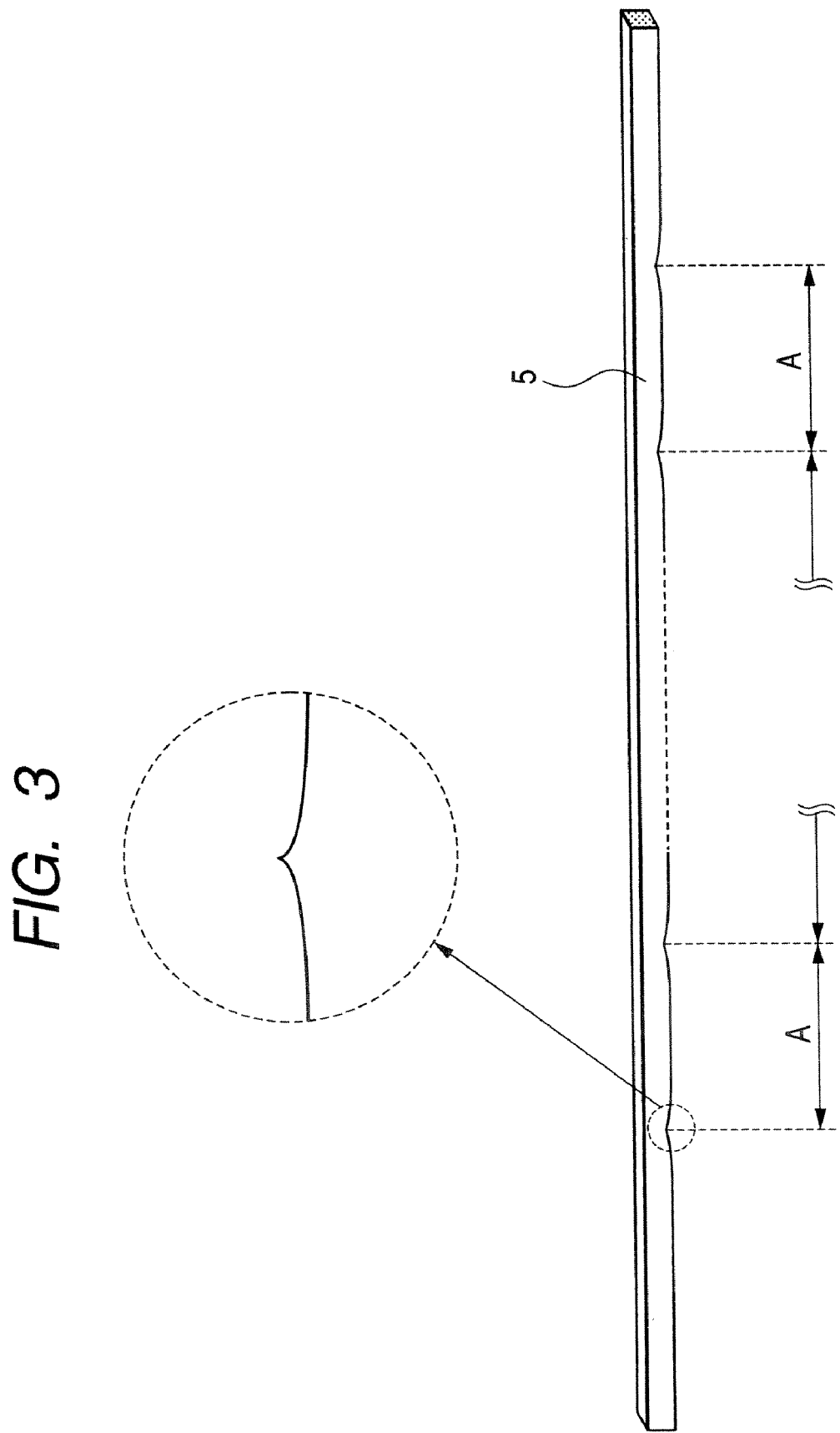
FIG. 3 is a diagram showing a position and a schematic shape of a cutout portion of the transparent plate according to the first embodiment of the invention.

FIG. 3 shows groove portions (cutout portions) which are formed on the bottom surface of the transparent plate 5 and the pitch (A) of the cutout portions coincides with the mounting pitch of the sensor chips 6. In the drawing, portions identical to or corresponding to those of FIG. 1 are referred to by the common symbols.

FIG. 4 shows the positional relationship between the adjacent sensor ships 6 on the sensor substrate 7. In this figure, a reference symbol P denotes a distance between image pickup elements, P' denotes a distance between boundary image pickup elements, and S denotes a size of the light receiving region of the image pickup element 11, in which the light receiving region is square or rectangular. A reference symbol Lgap denotes a gap portion (gap) between the adjacent sensor chips 6, and lie denotes image pickup elements (boundary image pickup elements) located at the both ends of the semiconductor chips 6. In the drawing, portions identical to or corresponding to those of FIG. 2 are referred to by the common symbols.

FIG. 5 is a side view to show the shape of a part of the cutout portion of the transparent plate 5. The cutout portions of the transparent plate 5 are formed with a constant pitch in a longitudinal direction (reading width direction) of the transparent plate. The cutout portion is formed in a relatively steep mountain shape. Similarly, FIG. 6 is a side view to show the shape of a part of the cutout portion of the transparent plate 5. The cutout portions of the transparent plate 5 are also formed with a constant pitch in a longitudinal direction of the transparent plate. This cutout portion is formed in a mountain shape with a relatively gentle slope. In this embodiment, each of these transparent plates 5 is formed by subjecting plastics material using transparent acrylic acid resin to the injection molding thereby to form the cutout portions.

The transparent plate 5 may be formed by transparent soda glass material and then subjected to the grinding processing to form the cutout portions. Alternatively, in view of chips and breakages of the cutout portions, the soda glass material may be in a concentrated manner subjected to the etching processing at portions corresponding to the deepest portions of the cutout portions by using hydrofluoric acid (HF solution).

Further, in the case of forming the transparent plate by plastic material, the cutout portions may be baked after being processed by using both the injection molding process and the etching process thereby to secure the transparency.

In general, in a case where the refractive index of medium A is larger than that of medium B, as shown in FIG. 7, light which incidents not vertically to a surface of the medium B from the medium A is refracted and bent at the boundary between the medium A and the medium B. If the boundary between the medium A (refractive index n=1.5) and the medium B (refractive index n=1.0) is inclined right-side up with respect to a horizontal line of the surface of paper, the refracted light is bent in a left direction with respect to the incident light. If the boundary between the medium A and the medium B is inclined right-side down, the refracted light is bent in a right direction with respect to the incident light.

Figure 8:
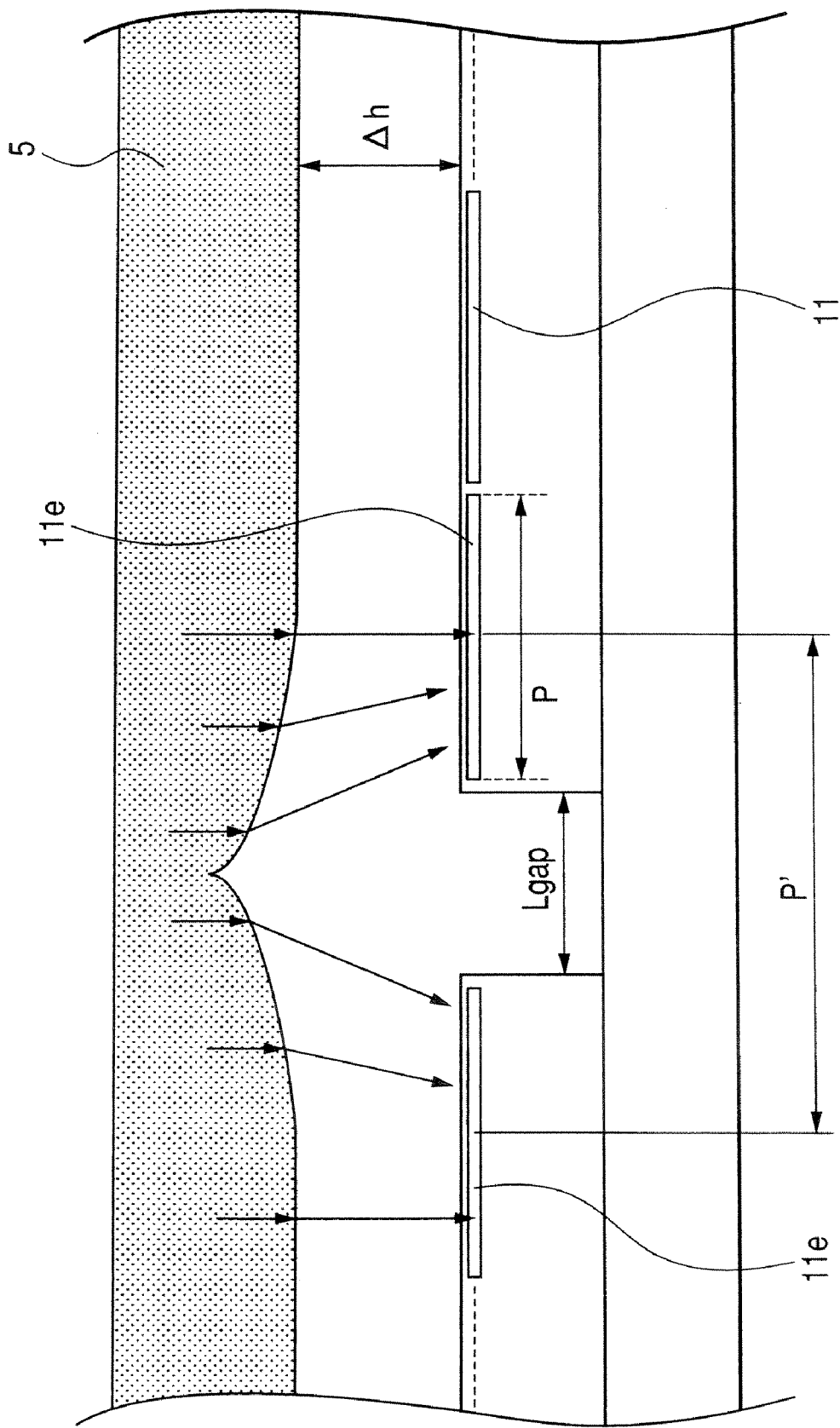
FIG. 8 is a diagram for explaining an optical path on the sensor substrate of the image sensor according to the first embodiment of the invention.

FIG. 8 is a schematic diagram to show the directions of refracted light passed through the transparent plate 5 and directed to the sensor substrate 7. In this case, the vertical light incident on the boundary region between semiconductor chips 6 is refracted and incident dividedly to the directions of image pickup elements (boundary image pickup elements) lie located at the boundary. In the drawing, portions identical to or corresponding to those of FIG. 1 are referred to by the common symbols.

Further, in FIG. 8, $\Delta h$ represents a distance between the bottom surface of the transparent plate 5 and the image pickup element 11. For example, when the imaging distance between the rod lens array 4 and the image pickup element 11 is 2.5 mm and the transparent plate 5 with a thickness of 1.2 mm is disposed at the center position of the imaging distance, $\Delta h$ becomes 0.65 mm. In view of the imaging position, the transparent plate 5 is not necessarily disposed at the center position between the rod lens array 4 and the image pickup element 11 but the position of the transparent plate may be changed depending on the adjacent density of the of the image pickup elements 11 of the sensor chip 6 mounted on the sensor substrate 7 so long as the transparent plate is disposed between the rod lens array 4 and the sensor substrate 7.

For example, although the pixel pitch of the image sensor having the resolution of 8 dots/mm is 0.125 mm, the pixel pitch of the image sensor having the resolution of 300 dpi is about 0.084 mm. Thus, in order to dividedly incident refracted light from the center position of the gap between the adjacent sensor chips 6 toward the image pickup elements 11, $\Delta h$ is set to be smaller as the resolution becomes higher thereby to make the bending degree of the refracted light smaller, thereby to adjust the influence on the image pickup elements 11 disposed at the insides in adjacent to the boundary image pickup elements 11$e$. Further, since the dividing operation of incident light is performed by the cutout portions of the transparent plate 5, as for the image sensor having the resolution of 400 dpi or more, the bottom surface region of the transparent plate 5 other than the cutout portions which is flat over the reading direction may be made in contact with the sensor chips 6 thereby to make the $\Delta h$ almost zero. In particular, as for the image sensor having the resolution of 1,200 dpi, since the number of the imaginary image pickup elements 11 is about five, the interpolation processing using interpolation data is not insufficient. In contrast, when the cutout portions are used in the aforesaid manner, advantageously, light refracted at the cutout portions can be incident directly into the image pickup elements 11 at the both ends of the sensor chips 6.

Since the center position of the gap between the sensor chips 6 varies slightly in the manufacturing procedure of the sensor substrate 7, this center position of the gap means design center position between the sensor chips 6 which are disposed with a predetermined pitch.

In this manner, since the transparent plate 5 is disposed between the rod lens array 4 and the sensor chips 6 so as to be provided on the sensor substrate 7 side thereof with the cutout portions each of which has the maximum depth at the center position of the gap between the adjacent semiconductor chips 6 and reduces gradually in its depth in accordance with the distance from the center position, thereby to dividedly incident on the image pickup elements 11 side light which incidents at the gap regions between the adjacent semiconductor chips 6 among light focused (converged) by the rod lens array 4. Thus, light at the regions corresponding to the imaginary image pickup elements can be suitably received by the image pickup elements 11 including the boundary image pickup elements 11e located at the both ends of the semiconductor chips 6 and so obtained as the photoelectric conversion output.

Second Embodiment

Although, in the first embodiment, the transparent plate 5 is formed by the plastic injection molding thereby to obtain the cutout portions and light is refracted due to the difference of refractive index of plastics and the refractive index of the space, the second embodiment will be explained as to a method in which the refractive index of a desired region corresponding to the cutout portion is continuously changed instead of providing the cutout portion.

Figure 9:
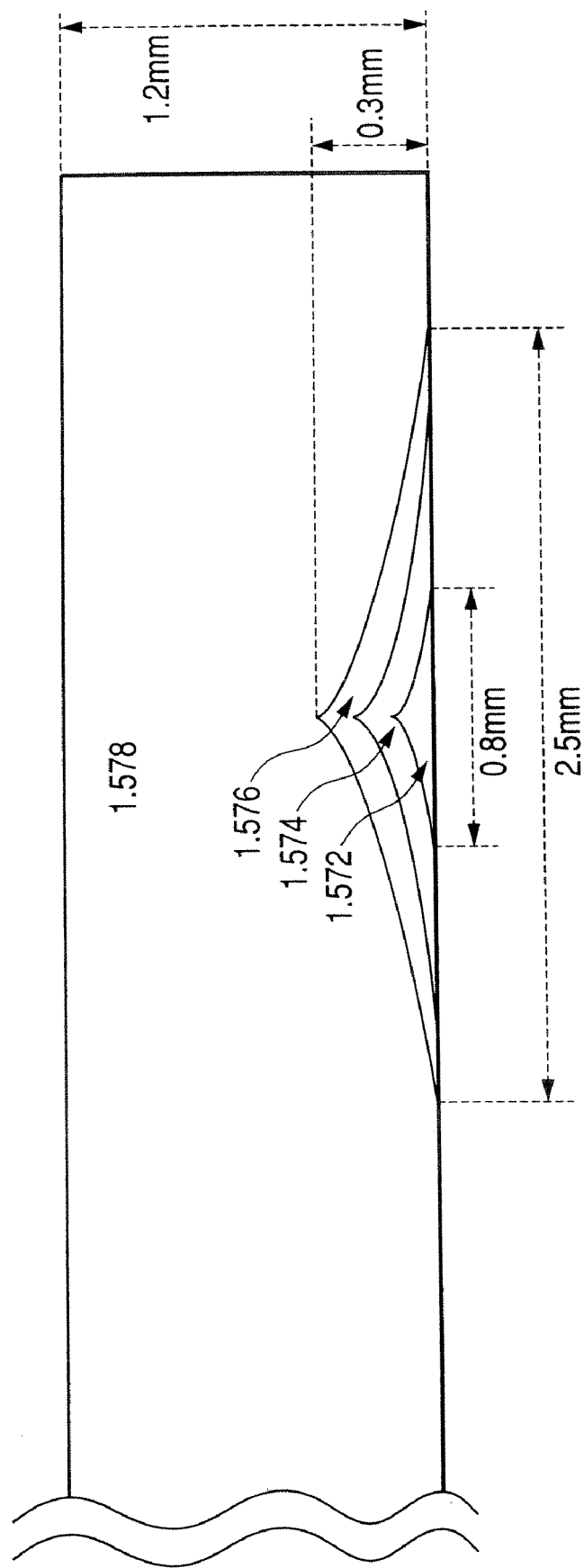
FIG. 9 is a diagram showing a refractive index distribution of the transparent plate of the image sensor according to a second embodiment of the invention.
Figure 10:
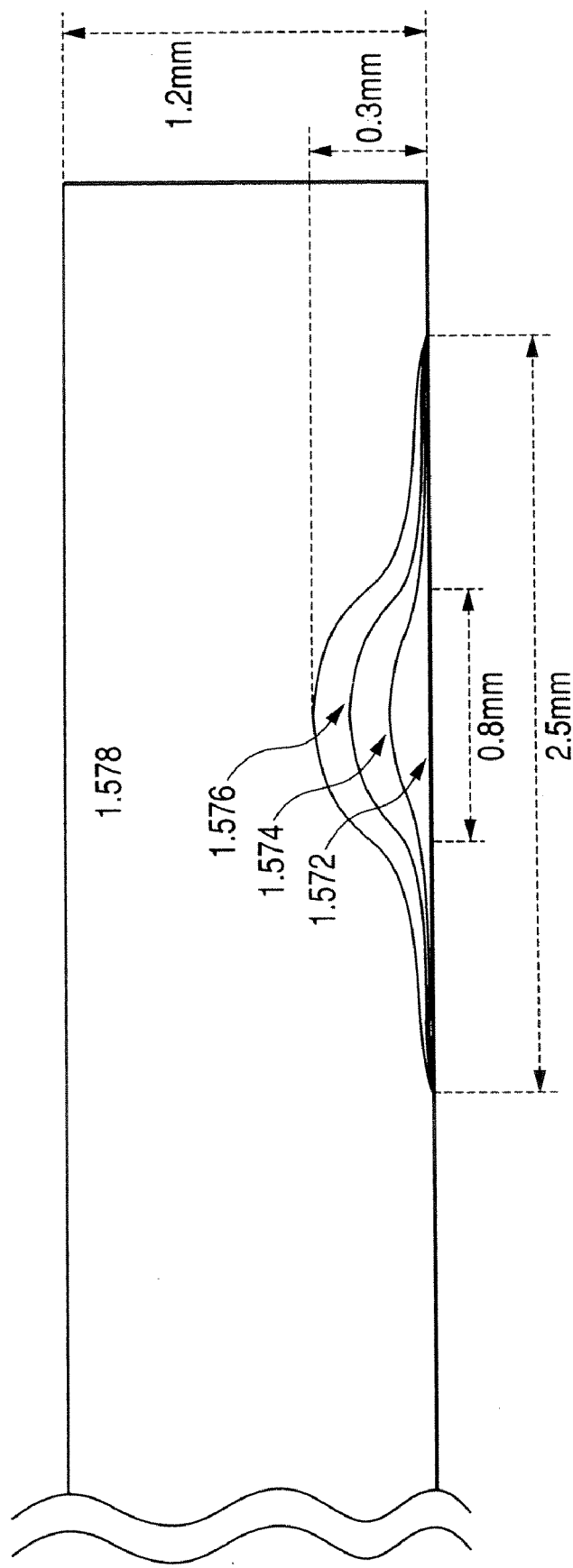
FIG. 10 is a diagram showing the refractive index distribution of the transparent plate of the image sensor according to the second embodiment of the invention.

FIG. 9 is a side view showing the refractive index of a part of the desired region of the transparent plate 5, in which the desired regions of the transparent plate 5 are formed with a constant pitch along the longitudinal direction thereof. The distribution pattern of the refractive index has a mountain shape. Similarly, FIG. 10 is a side view showing the refractive index of a part of the desired region of the transparent plate 5, in which the desired regions of the transparent plate 5 are formed with a constant pitch along the longitudinal direction thereof. This distribution pattern of the refractive index has an arc shape. Each of these transparent plates 5 is constituted as transparent soda glass by glass material containing $SiO_2$ as a main component, which is constituted by an ion-exchangeable component containing lithium oxide ($Li_2O$) and lead oxide (PbO) etc. Although the distribution pattern of the refractive index of each of FIGS. 9 and 10 is shown for the sake of convenience to have boundaries such that the refractive indexes change stepwise from the mother material having a constant refractive index, the refractive index changes continuously within the mother material.

Figure 11:
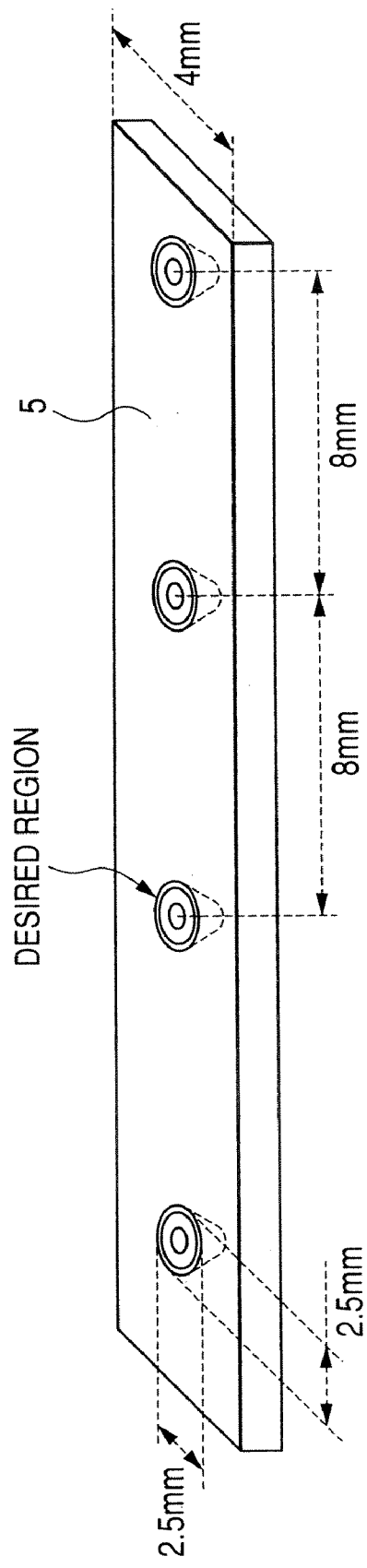
FIG. 11 is an outer view of the transparent plate according to the second embodiment of the invention.

FIG. 11 shows the desired regions of the transparent plate 5 at each of which the refractive index has the continuously changed distribution pattern. The transparent plate has a width of 4 mm along the transfer direction of the object 3 to be picked image up. The desired region has a circular shape of about 2.5 mm in view of the aperture angle (about 20 degrees) of the rod lens array 4 located above. Further, since the gaps between the adjacent semiconductor chips 6 are formed with a pitch of 8 mm, the circular regions are also formed with a pitch of 8 mm along the gaps of the semiconductor chips. In the drawings, portions identical to or corresponding to those of FIG. 1 are referred to by the common symbols.

Figure 12:
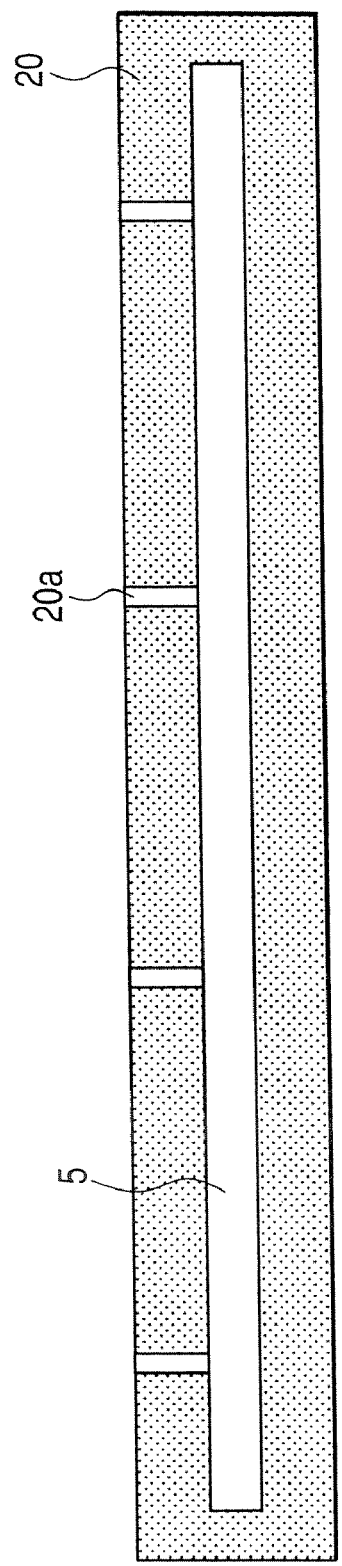
FIG. 12 is a diagram for explaining a masking method of the transparent plate according to the second embodiment of the invention.

Next, the explanation will be made as to a manufacturing method of forming the refractive index distribution of the desired region of the transparent plate 5. FIG. 12 is a diagram to show the relation between the transparent plate 5 and a mask for chemically processing the desired regions of the transparent plate 5, in which a reference numeral 20 denotes a hollow metal mask (also called as a metal mask member) which is formed by bending a thin plate of stainless steel (SUS) with a thickness of 1 mm in a rectangular shape, and 20a denotes a hole (hole portion) formed by subjecting the metal mask 20 in a thin plate state to the metal etching process. In the drawing, portions identical to or corresponding to those of FIG. 1 are referred to by the common symbols.

Figure 13:
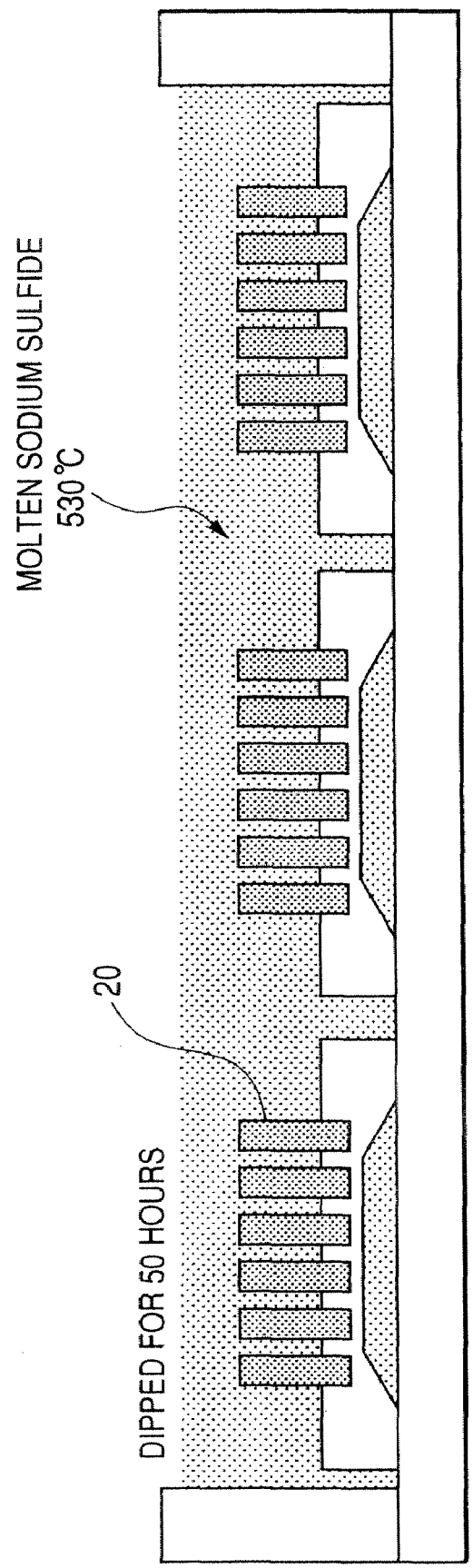
FIG. 13 is a diagram for explaining a manufacturing principal of the transparent plate according to the second embodiment of the invention.

First, the transparent plate 5 is inserted into the metal mask 20 and the desired regions of the transparent plate 5 are positioned with the holes 20a of the metal mask 20, respectively. FIG. 13 is a diagram showing a state where the metal mask 20 in which the transparent plate 5 is inserted is dipped within a solution.

Usually, in order to form this kind of refractive index distribution, sodium sulfide solution is pored around a column-shaped transparent glass containing lithium oxide and lead oxide, for example. Then, the lithium oxide ions are exchanged by ions within the solution by the ion exchange method thereby to form the refractive index distribution of a concentric shape in which the refractive index increases gradually toward the inner portion of the column-shaped glass from the surface thereof. In this case, the temperature of the sodium sulfide solution is increased to the transition temperature of the transparent glass and the transparent glass is dipped within the solution for about 10 to 50 hours.

In contrast, according to the second embodiment, the refractive index distribution region in which the refractive index changes continuously is formed at each of the desired regions formed on the one surface of the transparent plate 5 as described above so as to have a heterogeneous refractive index distribution in which the refractive index also as the refractive index of the mother material reduces symmetrically toward the surface portion from the deep portion having a high refractive index in both the surface direction and the thickness direction.

Figure 14:
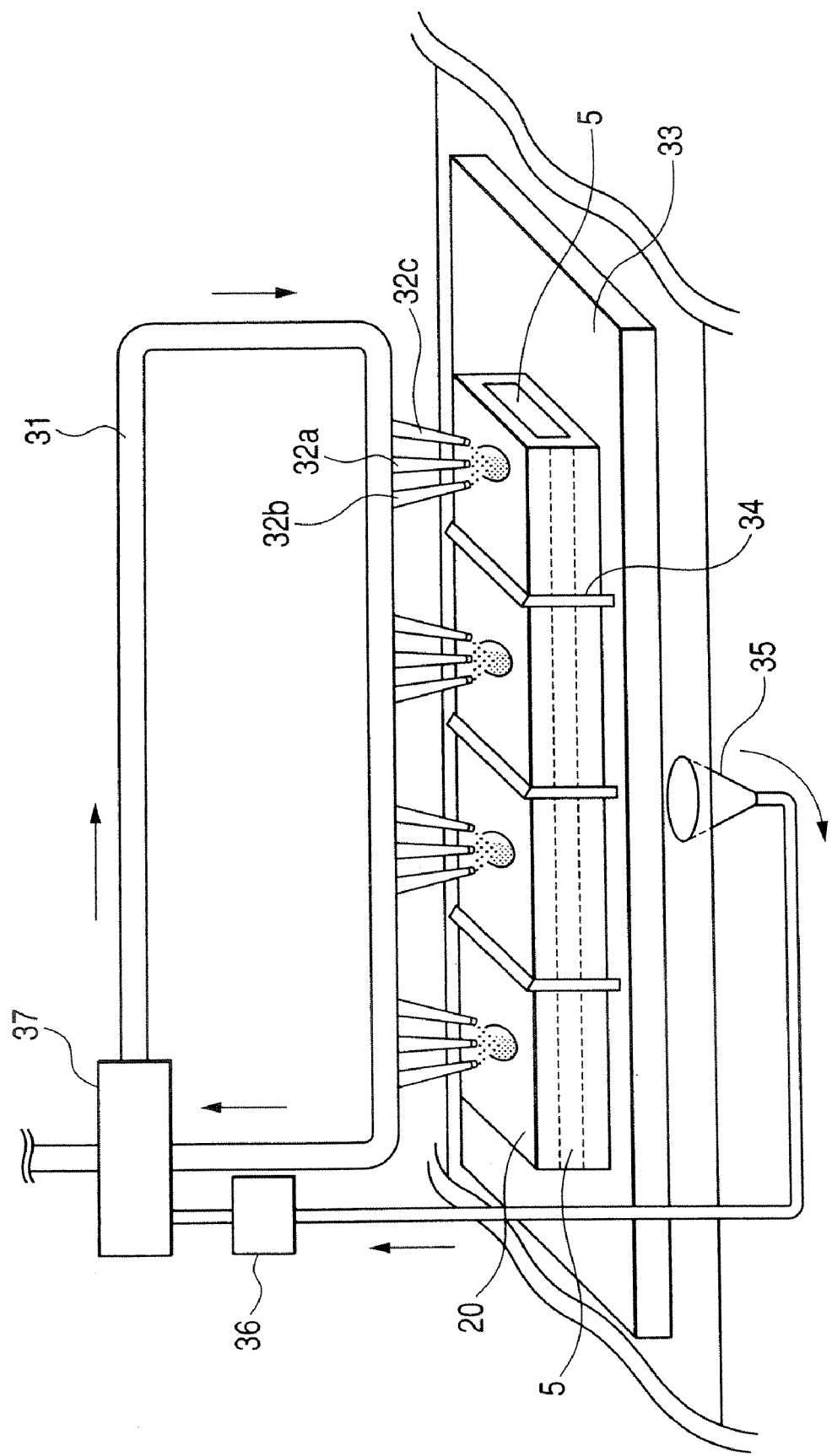
FIG. 14 is a diagram for explaining the manufacturing method of the transparent plate according to the second embodiment of the invention.

FIG. 14 is a diagram for explaining the manufacturing method of the transparent plate 5 which is mounted on the image sensor according to the second embodiment, in which a reference numeral 31 denotes a metal pipe for circulating the sodium sulfide solution, 32 denotes a nozzle with an inner diameter of about 0.2 mm serving as an ejection port provided at the predetermined position of the metal pipe 31 for ejecting the sodium sulfide solution, 32a denotes a first nozzle, 32b denotes a second nozzle, and 32c denotes a third nozzle. Each of these nozzles 32 has an ejection port directed to the center of the desired region of the transparent plate 5. A reference numeral 33 denotes a surface table on which the metal mask 20 is placed, 34 denotes a metal band (wire) made from phosphor bronze which is fixed to the surface table and adhesively contacts the metal mask 20 with the transparent plate 5, 35 denotes an ejection port for the sodium sulfide solution, 36 denotes a filter for cleaning the circulated solution, and 37 denotes a circulation pump for supplying the sodium sulfide to the metal pipe 31 with a flow rate of 5 little/min. The flow rate of the circulation pump 37 is not limited to 5 little/min. and is adjustable so as to delay the change of the chemical processing speed caused by the solution thereby to change the shape of the refractive index distribution of the transparent plate 5 and to enable the dropping treatment of the nozzle 32. In the drawing, portions identical to or corresponding to those of FIG. 12 are referred to by the common symbols.

Figure 15:
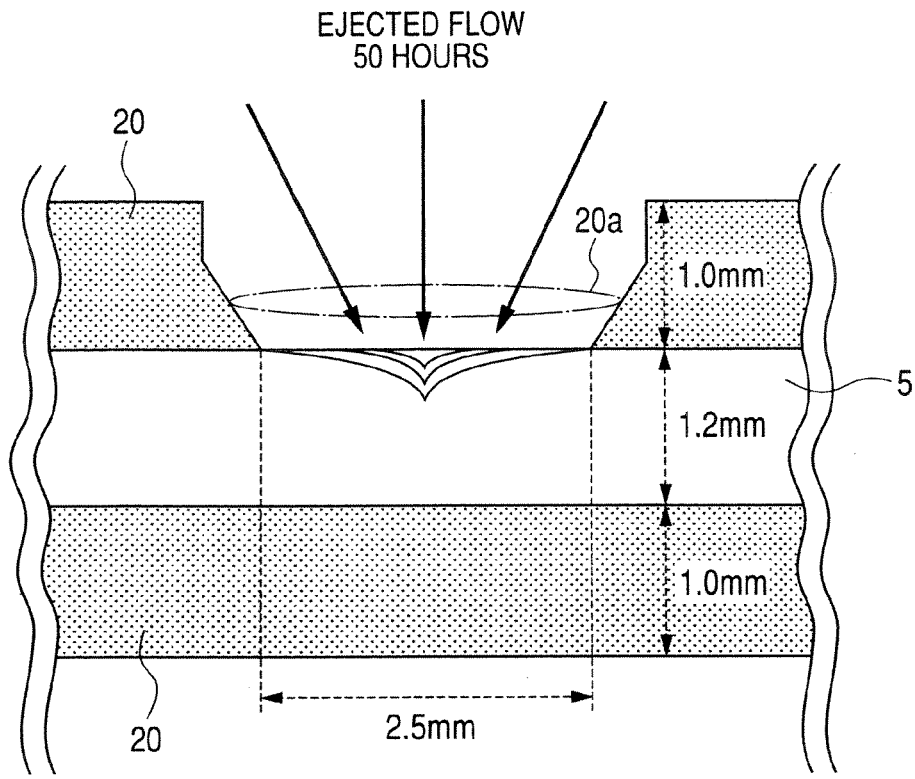
FIG. 15 is a partial sectional view for explaining the relation between the holes of a metal mask and the transparent plate according to the second embodiment of the invention.
Figure 16:
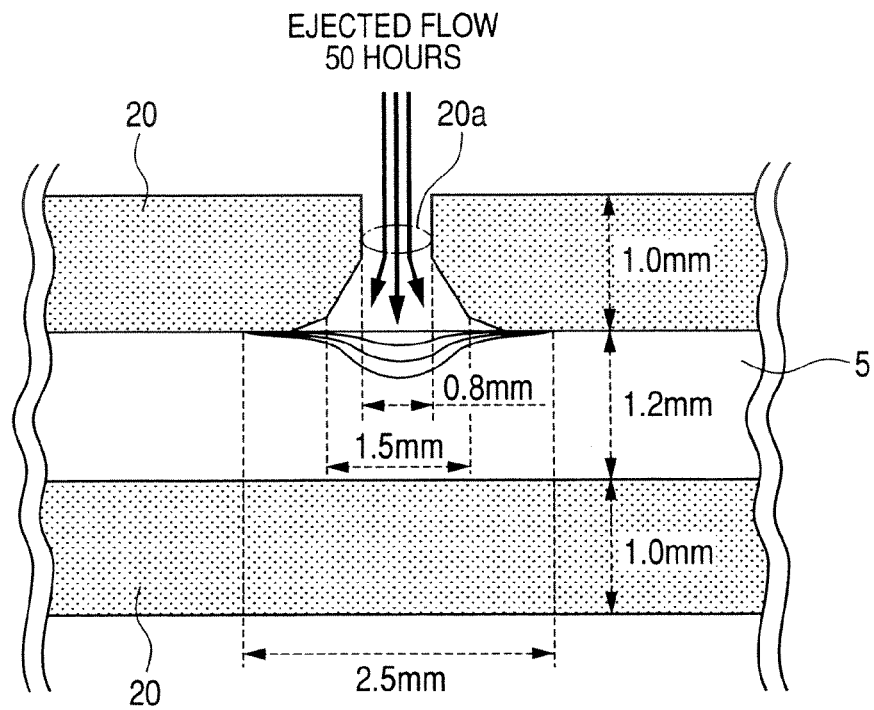
FIG. 16 is a partial sectional view for explaining a relation between the holes of the metal mask and the transparent plate according to the second embodiment of the invention.

FIGS. 15 and 16 are diagrams for explaining the change of the refractive index distribution at the desired region of the transparent plate 5 according to the shape of the hole 20a of the metal mask 20. The ejection position of the solution ejected from the nozzle 32 is set so as to be concentrated at the center portion of the hole 20a thereby to positively perform the ion exchange at a part of the transparent plate 5 located below the center of the hole 20a. In the case of the shape of the hole 20a shown in FIG. 15, since the section of the hole 20a is configured to have a tapered shape with a narrower opening width along the flowing direction of the solution ejected from the nozzle 32, the refractive index distribution of the mountain shape shown in FIG. 9 is obtained. In contrast, in the case of the shape of the hole 20a shown in FIG. 16, since the section of the hole 20a is configured to have a tapered shape with a wider opening width along the flowing direction of the solution ejected from the nozzle 32, the refractive index distribution of the arc shape shown in FIG. 10 is obtained.

Figure 17A:
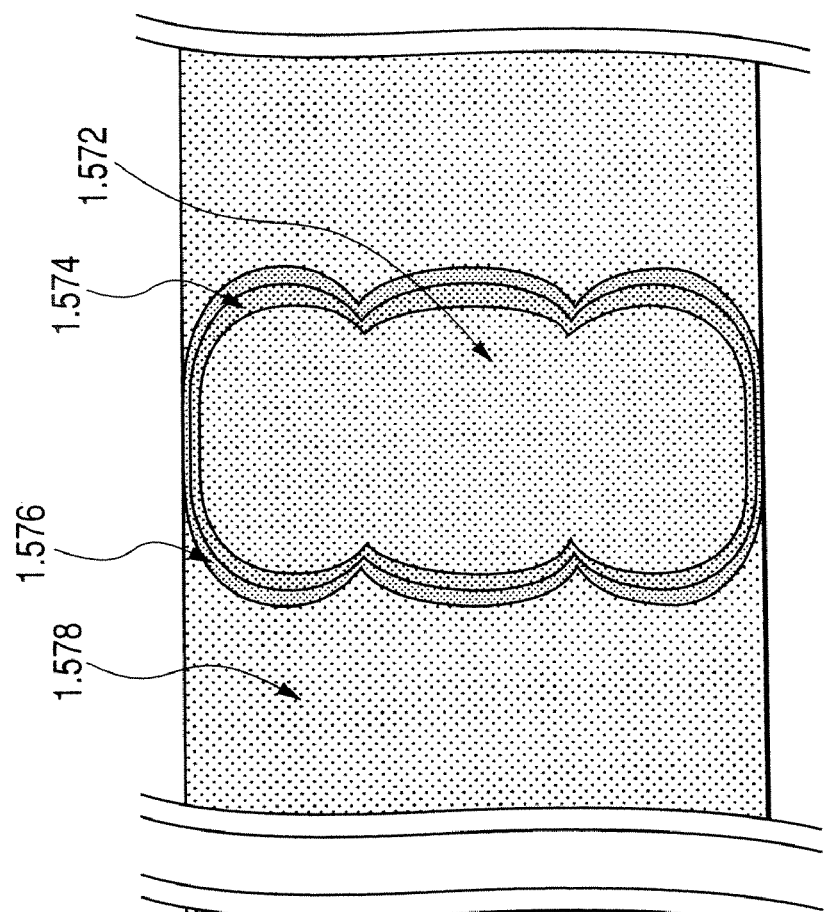
FIGS. 17A and 17B are partial plan views of the transparent plate of the image sensor relating to the second embodiment of the invention.
Figure 17B:
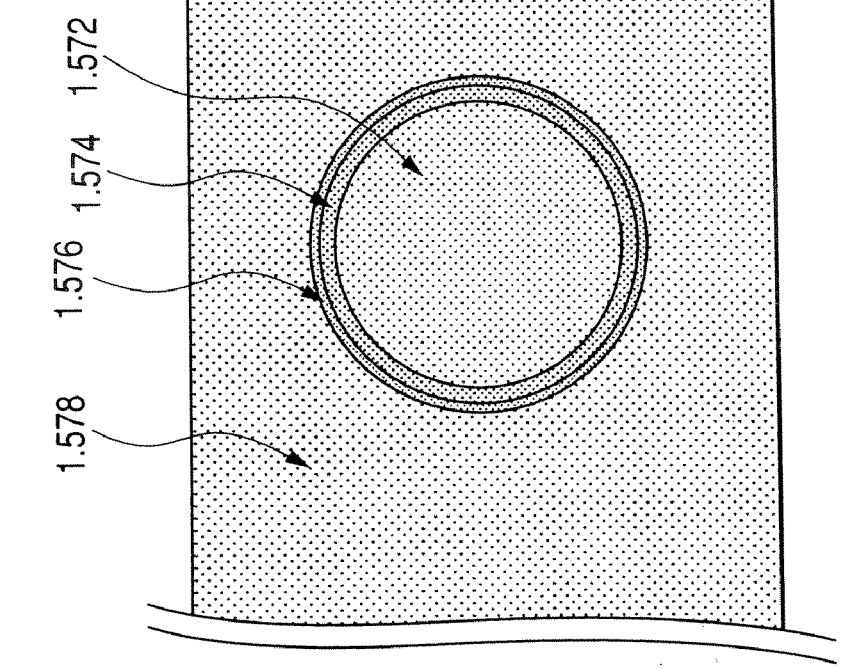

FIG. 17 is partial plan views each for explaining the refractive index distribution of the transparent plate 5 perspectively seen from the bottom surface side of the transparent plate on the image pickup element 11 side toward the upper surface side of the transparent plate on the lens 4 side. In the second embodiment, the solution is ejected toward the center of the desired region of the transparent plate 5 by using three nozzles 32 thereby to render the refractive index change region so as to have the refractive index distribution of the continuous concentric shape as shown in FIG. 17A. In contrast, it is possible to dispersedly dispose the nozzles 32a, 32b, 32c along the short side direction (transfer direction of the object 3 to be picked image up) perpendicular to the longitudinal direction of the transparent plate 5 so as to eject the solution dispersedly thereby to obtain the transparent plate 5 which refractive index changes continuously in the longitudinal direction (reading width direction) like the first embodiment, as shown in FIG. 17B.

In particular, when each of the lens portions of the rod lens array 4 for incident light into the image pickup elements 11 has such an aperture angle that the field of view as to a major light treated by the each lens portion of the rod lens array is less than 0.8 mm in a diameter, such a phenomenon, caused by that the center position of the lens portion and the center position of the image pickup element 11 shift to the transfer direction of the object 3 to be picked image up with respect to the original optical path shaft, can be prevented from occurring that the sharpness of the edge portion of a sequentially-changing image degrades and so an image quality degrades. Incidentally, although the distribution pattern of the refractive index of each of FIGS. 17A and 17B is shown for the sake of convenience to have boundaries such that the refractive indexes change stepwise from the mother material having a constant refractive index, the refractive index changes continuously within the mother material.

In the second embodiment, the sodium sulfide solution at 530 degrees centigrade is ejected from the nozzle 32 with respect to the transparent plate 5 containing lithium oxide and lead glass. However, as for the transparent plate 5 containing no lead glass, since the transition temperature increases, the temperature of the solution is desirably to be set at a temperature slightly higher than 530 degrees centigrade In contrast, when the transparent plate 5 formed by plastic material is used, the effects corresponding to that of the second embodiment can be obtained by chemically treating the transparent plate at a temperature lower than 530 degrees centigrade.

Furthermore, in the second embodiment, the chemical treatment time is set to 50 hours. In contrast, when the chemical treatment time is made shorter, the refractive index distribution in the depth direction shown in FIGS. 9 and 10 becomes thin and shallow, it is possible to obtain the transparent plate 5 matched to the design size (Lgap) of the gap between the sensor chips 6.

As described above, according to the image sensor and the manufacturing method thereof shown in the second embodiment even when there is a large gap between the adjacent semiconductor chips and no image pickup element 11 is provided at the gap region, the original light from the object 3 to be picked image up can be received by the image pickup elements 11 and the degree of the variation of the steep bending of the refraction light at the gap region of the adjacent semiconductor chips is reduced, whereby light incident in the gap regions can be reproduced with high fidelity.

Third Embodiment

In the first embodiment, since the transparent plate 5 having the cutout portions is inserted into the optical path of the image sensor, there partially arises a region having different conjugate length. Thus, in the third embodiment, the explanation will be made as to a method of coinciding the conjugate length between the cutout portion and the flat-surface portion having no cutout portion of the transparent plate 5. That is, since a subject having a refractive index larger than that of the air is inserted into an optical path through which the reflection light from the object 3 to be picked image up passes to the image pickup elements 11 via the rod lens array 4, the description will be made that the focal distance becomes long and that the conjugate length as an optical length from the cutout portion differs from the conjugate length as an optical length from the portion other than the cutout portion.

In general, when a material is disposed in the optical path, the apparent focal distance becomes longer than that of the air due to the refractive index of the material, as represented by the following expression:

$$\Delta t = \{(n-1)/n\} \cdot t$$

where $\Delta t$ denotes an extended distance, n denotes the refractive index of the material, and t denotes the thickness of the material though which light passes.

For example, when the material within the optical path is only the air with the refractive index of 1.00, the focal position is at a point away by 2.1 mm from the bottom surface of the lens 4. When the material with the refractive index larger than that of the air is inserted into the optical path, the focal length becomes longer than 2.1 mm. Supposing that the refractive index of glass is about 1.51, when the glass with a thickness of 1.2 mm is inserted into the optical path, the focal length becomes 2.5 mm which is longer by about 0.40 mm as compared with the case where no material is inserted into the optical path.

In the third embodiment, the explanation will be made as to a method of calculating the conjugate length of light incident into the gap region from the cutout portion and the conjugate length of light incident into the gap region from the portion other than the cutout portion shown in the first embodiment and a method of coinciding these conjugate lengths. Supposing that the depth of the deepest portion of the cutout portion is 0.1 mm as for the transparent plate 5 with the thickness of 1.2 mm as shown in FIGS. 5 and 6, the extended amount of the conjugate length from the cutout portion is 0.37 mm, whilst the extended amount of the conjugate length from the portion other than the cutout portion is 0.4 mm, sot that it will be clear that there is a difference of the conjugate length of 0.03 mm therebetween.

Figure 18:
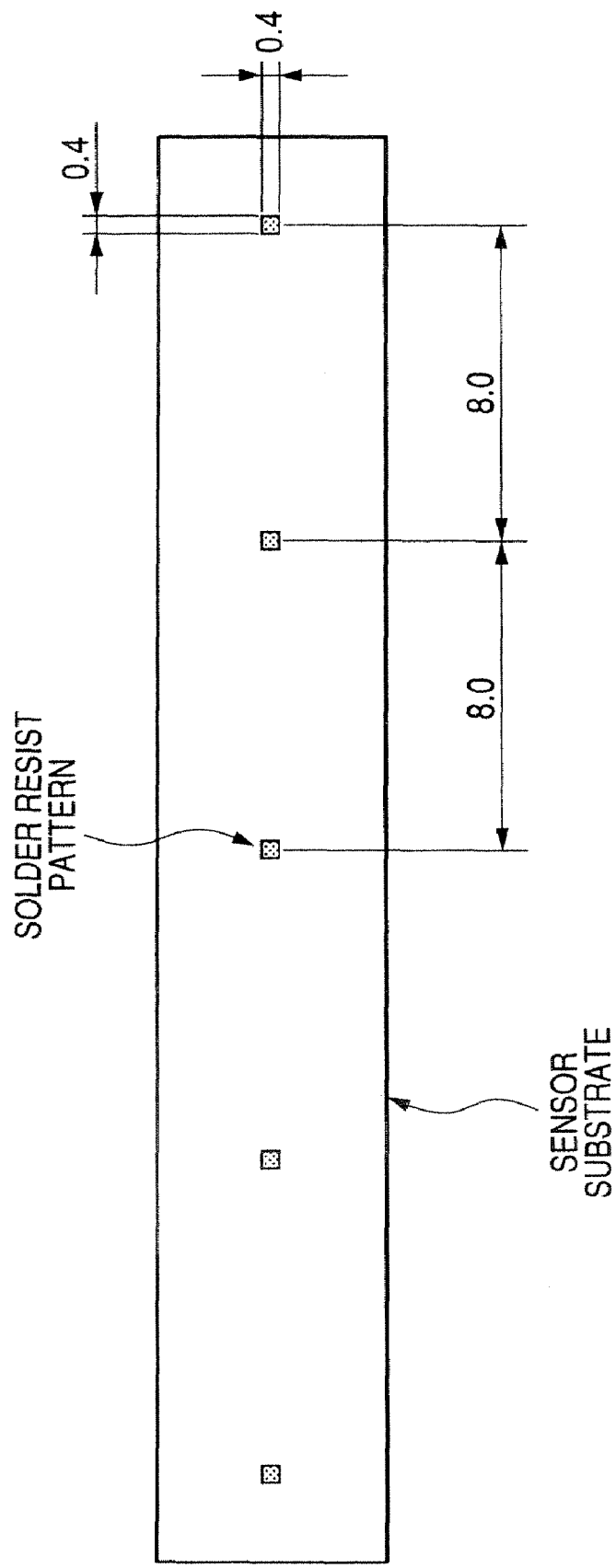
FIG. 18 is a diagram showing a solder resist pattern of the sensor substrate of the image sensor according to a third embodiment of the invention.

FIG. 18 shows a solder resist pattern formed, so as to cover the gap regions between the adjacent sensor chips 6, by printing solder resist material (thin film member) on the sensor substrate 7 constituted by a print wiring board. This pattern is formed so as to have a size of 0.4 mm square (□) with a pitch of 8 mm and have a thickness of about 0.03 mm. This pattern is called as a step portion.

Figure 19:
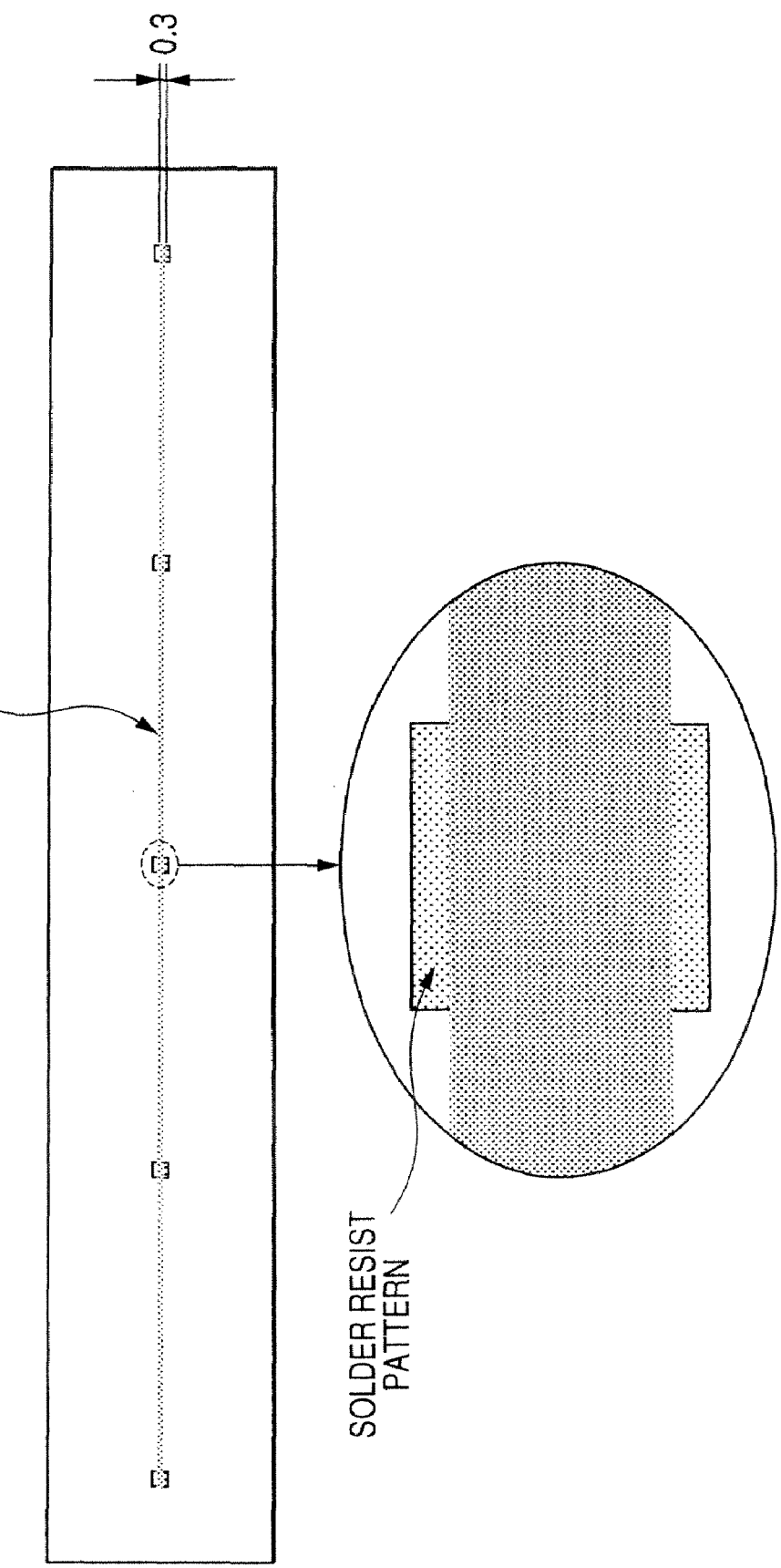
FIG. 19 is a diagram showing a die bond pattern of the sensor substrate according to the third embodiment of the invention.
Figure 20:
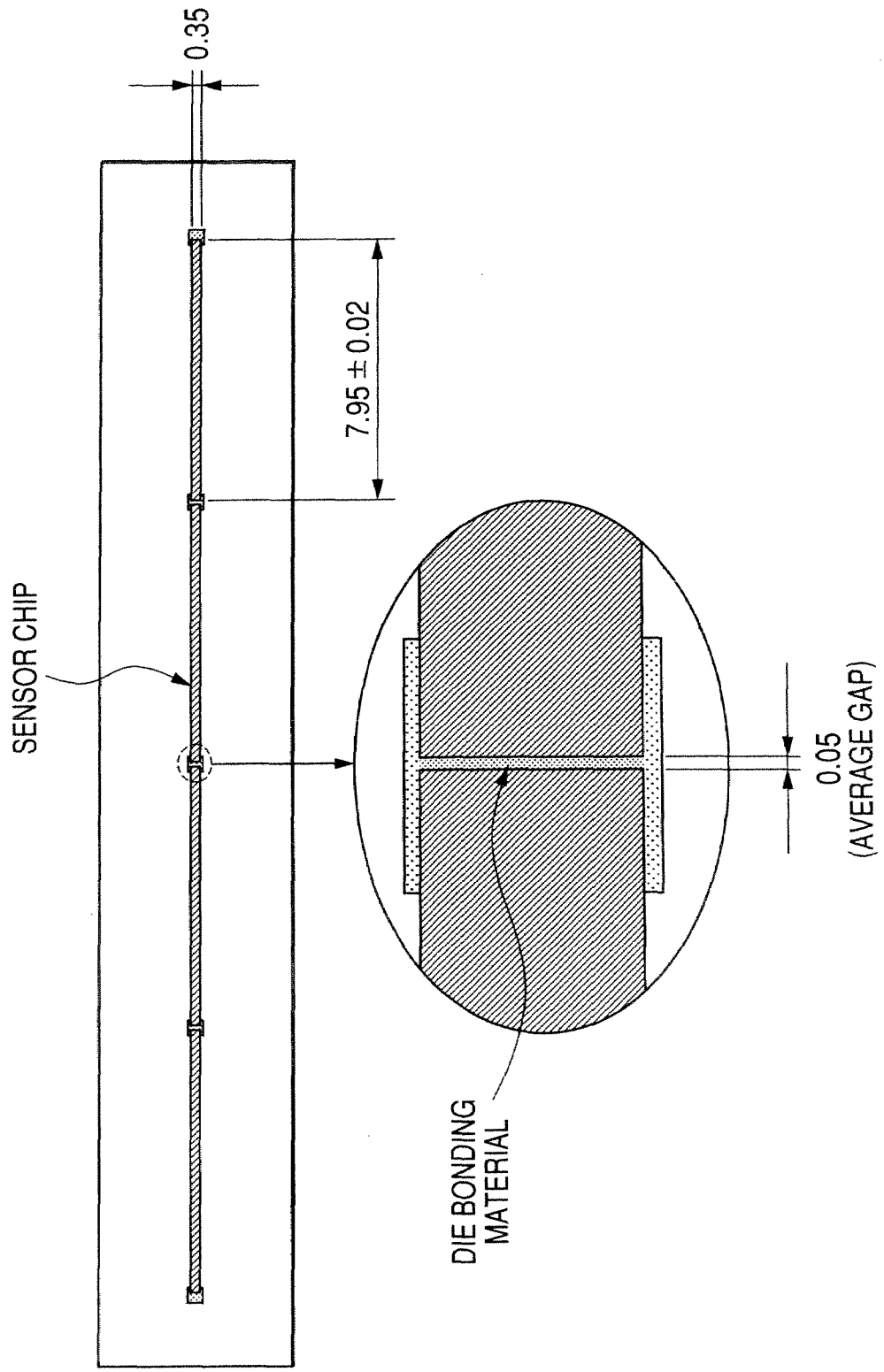
FIG. 20 is a plan view showing a state where the sensor chip of the image sensor is mounted, according to the third embodiment of the invention.

FIG. 19 shows a die bond pattern in which a die bond paste for mounting the sensor chips 6 thereon is printed in a belt shape with a width of 0.3 mm. FIG. 20 is a plan view of the sensor substrate 7 on which the sensor chips 6 (each having a length of 7.95 mm, a width of 0.35 mm and a thickness of 0.35 mm) are mounted by the die bonder (mounting device) on the die bond pattern thus printed.

Figure 21:
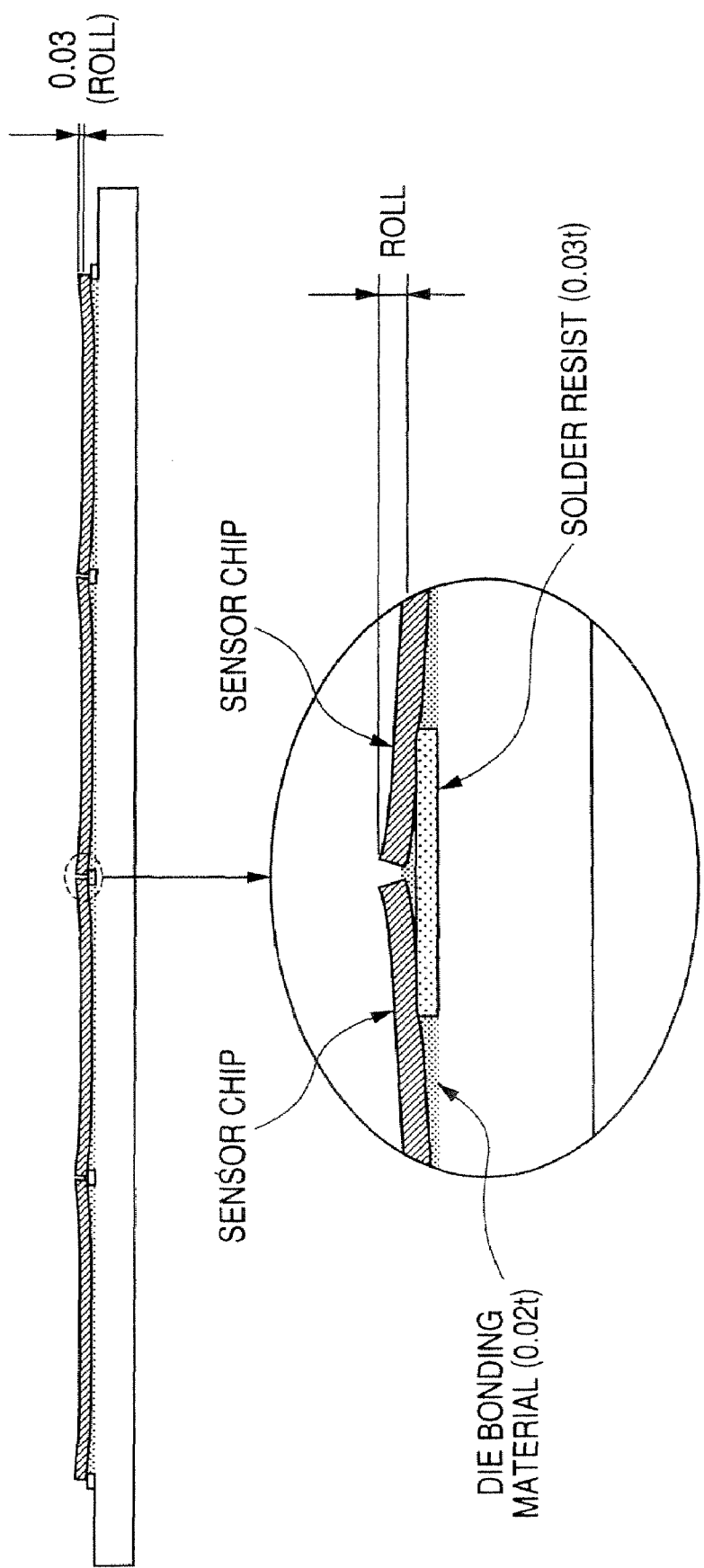
FIG. 21 is a side view showing the sensor substrate of the image sensor according to the third embodiment of the invention.

FIG. 21 is a side view of the sensor substrate 7 on which the sensor chips 6 are mounted. The die bond paste has a thickness (t) of about 0.02 mm after being cured. In FIG. 21, a step is provided by the solder resist at each of the gap regions between the adjacent sensor chips 6. Since a size ratio (L/W) between the size (L) in the longitudinal direction and the size (W) in the short side direction of the sensor chip 6 is 20 or more, the sensor chips 6 are firmly fixed to the sensor substrate 7 at the time of curing the die bond paste. As a result, the both ends of each of the sensor chips 6 are higher than the center portion thereof by about 0.03 mm. Thus, the image pickup element 11 formed on the surface of the sensor chip 6 also bends (roll) smoothly in a manner that the center portion thereof is low and becomes higher gradually toward the boundary image pickup elements 11e.

Therefore, since a light flux incident into the image pickup element 11 of the sensor chip 6 enters from the periphery containing the deepest portion of the cutout portion of the transparent plate 5, when the sensor chip is provided with the roll portion of about 0.03 mm corresponding to the thickness of the solder resist as described above, the conjugate length of light incident into the gap region from the cutout portion and the conjugate length of light incident into the gap region from the portion other than the cutout portion are made coincide The defocusing phenomenon at the region including the boundary image pickup elements 11e can also be prevented even when the conjugate length is made coincide with the image pickup element 11 at the center portion of the sensor chip 6.

In the third embodiment, the print wiring board is used as the sensor substrate 7. In contrast, a ceramic substrate etc. may be used as the sensor substrate, and a step may be provided by boron silicate lead glass (thin film member) etc. in place of the solder resist after the curing thereby to provide the sensor chip 6 with a roll portion of about 0.03 mm. When the length of the deepest portion of the cutout portion of the transparent plate 5 is large, the height of the step may be made larger in accordance with the length of the deepest portion thereby to change the roll portion into the optimum one suitable for preventing the defocusing. Incidentally, the shape of the step is not limited to a square (rectangular) but may be a cross such as a recognition target for mounting a chip and the step may be dividedly disposed at the boundary regions of the sensor chip 6.

As described above, according to the image sensor shown in the third embodiment, in order to eliminate the defocusing at the gap regions of the transparent plate 5, each of the sensor chips 6 is provided with the roll portion to approach the image pickup elements 11 at the both end sides of the sensor chips 6 on the transparent plate 5 side, whereby an image with a high accurate quality ca be maintained without causing any defocusing state.

Fourth Embodiment

In each of the first to third embodiments, the center of the cutout portion of the sensor chip 6 or the deepest portion of the refractive index distribution is made coincide on the design with the center position of the gap between the adjacent sensor chips 6. However, as shown in FIG. 20, the sensor chip 6 varies in its size by about ±0.02 mm in the dicing (cutout) process of the semiconductor. Further, even if the mounting accuracy of the mounting device is high, at the time of mounting the sensor chip 6, the sensor chip 6 constituted by the semiconductor chip may move randomly due to the shrinkage of the die bonding material serving as an adhesive upon the curing.

As a result, the gap between the adjacent sensor chips may vary between a state of almost zero where the adjacent sensor chips contact to each other and a state where a large gap of almost 0.1 mm exists. Further, such a gap often appears at each of the image sensors in which there are gaps between many semiconductor chips. Thus, in the fourth embodiment, the explanation will be made as to the transparent plate mounted on the image sensor in the case where the gap between the adjacent sensor chips 6 changes in a range of 0 to 0.1 mm.

Figure 22:
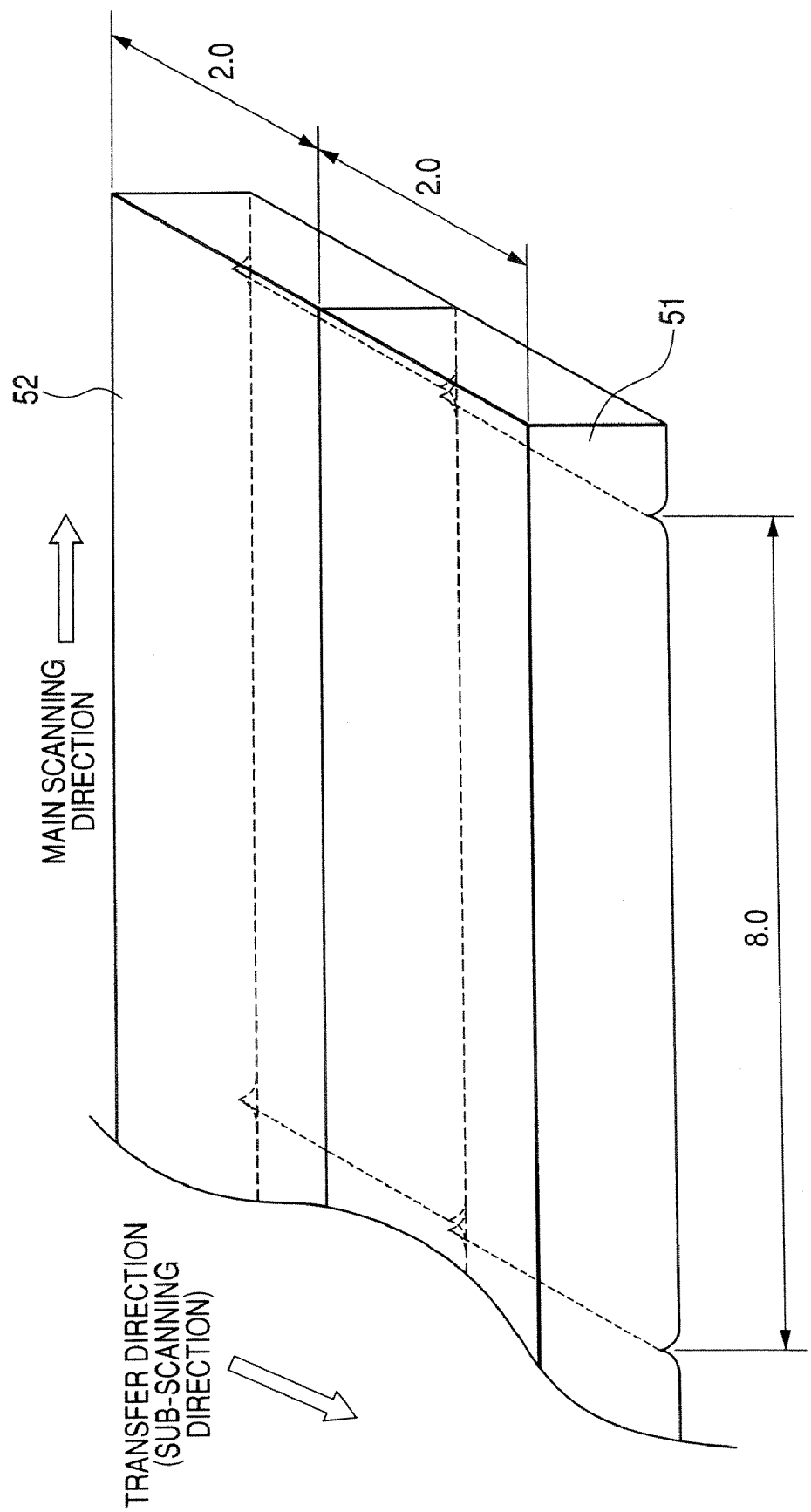
FIG. 22 is a partial perspective view of the transparent plate according to a fourth embodiment of the invention.
Figure 23:
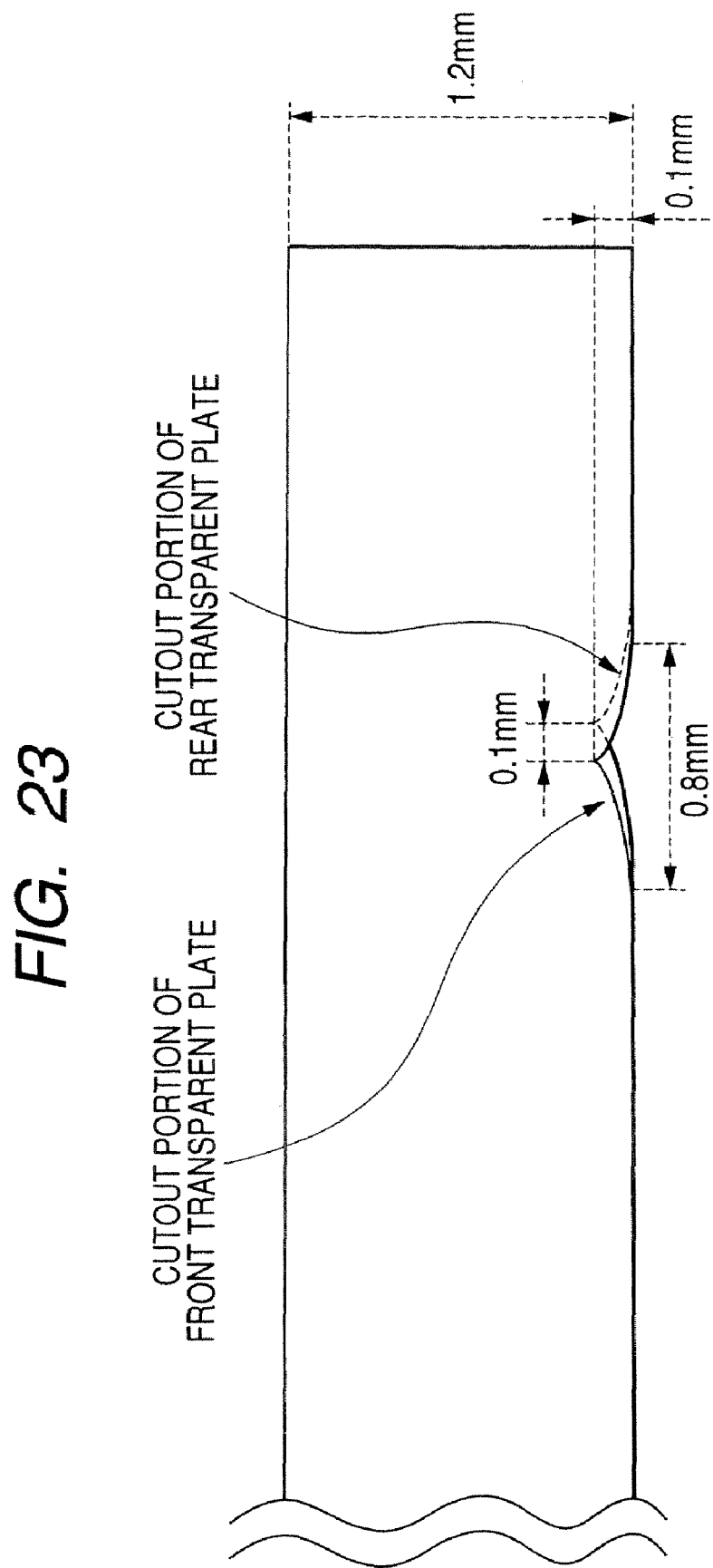
FIG. 23 is a partial side view for explaining the shape of the transparent plate according to the fourth embodiment of the invention.

Hereinafter, the fourth embodiment of the invention will be explained with reference to FIGS. 22 and 23. FIG. 22 is a perspective view showing a transparent plate according to the fourth embodiment of the invention. In FIG. 22, a reference numeral 51 denotes a front transparent plate (transparent member) and 52 denotes a rear transparent plate (transparent member). FIG. 23 is a partial side view showing the front transparent plate 51 and the rear transparent plate 52 laminated together. In FIGS. 22 and 23, each of the front transparent plate 51 and the rear transparent plate 52 is formed by subjecting plastics material to the injection molding, using the same die as the transparent plate 5 with a width of 4 mm shown in the first embodiment, thereby to form the cutout portions. In this case, the extruding size is adjusted so that each of the front transparent plate 51 and the rear transparent plate 52 has a width of 2 mm. Next, the front transparent plate 51 and the rear transparent plate 52 are made in contact and laminated together at their side surfaces using transparent adhesive in a manner that the cutout portions of these plates are shifted by 0.1 mm in the main scanning direction to each other thereby to form the laminated transparent plate with a width of 4 mm in total. Thus, the front transparent plate 51 and the rear transparent plate 52 are configured so as to be aligned in the transfer direction (sub-scanning direction) of the object 3 of the image sensor and then incorporated into the case 9 of the image sensor.

Next, the operation of this embodiment will be explained. The optical axis of the rod lens array 4 exists at the laminated boundary portion of the front transparent plate 51 and the rear transparent plate 52. The design centers of the cutout portions of these transparent plates are determined in a manner that the center of the cutout portion of the front transparent plate 51 locate at the end portion of one of the adjacent sensor chips 6 and the center of the cutout portion of the rear transparent plate 52 locate at the end portion of the other of the adjacent sensor chips 6, and then these laminated plates are mounted on the image sensor.

Each of the transparent plates 51, 52 incidents light dividedly to the image pickup elements 11 from near the end portions of the gaps of the sensor chips 6. In the first embodiment, light from the transparent plate 5 is dividedly incident from the design center of the gap between the adjacent sensor chips 6. In contrast, in the fourth embodiment, the refraction light is dividedly incident from the positions shifted in the opposite directions by 0.05 mm in the front transparent plate 51 and the rear transparent plate 52

As to the image sensor having the resolution of 8 dots/mm, the pitch of the pixels is 0.125 mm. Thus, when the cutout portions of the front transparent plate 51 and the rear transparent plate 52 are shifted by 0.1 mm in the reading main scanning direction to each other, the deviation of the dividedly incident positions therebetween is less than one pixel. Thus, as for the image sensor having large variations among the gap sizes of the sensor chips 6, this embodiment is largely effective in order to improve the average image quality at the imaginary image pickup regions.

Although, in the fourth embodiment, the refraction light is dividedly incident by using the front transparent plate 51 and the rear transparent plate 52 each having the width of 2 mm, the front transparent plate and the rear transparent plate each having the width of 1 mm may be laminated together alternately to form a transparent plate with width of 4 mm in total. In this case, the image quality in the reading sub-scanning direction is effectively improved.

Also in the method of dividedly incident light due to the change of the refractive index distribution as explained in the second embodiment, when the ejection direction of the solution from the nozzle 32 is changed partly, the technical effects similar to that of the fourth embodiment can be obtained.

That is, as shown in FIG. 24, when the three nozzles 32*a*, 32*b*, 32*c* are arranged in a manner that the first nozzle 32*a* ejects the solution to the center position of the transparent plate 5, and the nozzles 32*b* and 32*c* eject the solution to the positions shifted by 0.05 mm oppositely in the reading width direction with respect to the center of the transparent plate 5, respectively, the average image quality at the imaginary image pickup regions can be effectively improved even when the variations of the gaps among the sensor chips 6 is large.

Further, although the aforesaid configuration is arranged to eject the solution linearly to the transparent plate 5, five nozzles 32 may be used in a manner that the solution is ejected in an X-shape manner so as to cross the center position of the transparent plate 5. In this case, the image quality is also improved in the sub-scanning direction.

In the first to fourth embodiments, although the explanation is made as to the image sensor in which both the light source 1 and the image pickup elements 11 are disposed on the one surface side of the object 3 to be picked image up (object on which light is irradiated), the effects similar to those of the first to fourth embodiments can be obtained in a transmission type image sensor in which the light source 1 is disposed on the one surface side of the object 3 to be picked image up and the image pickup elements 11 are disposed on the other surface side of the object 3 to be picked image up so as to receive reflection light including reflection light and direct light from the light source 1 by the image pickup elements 11.

The entire disclosure of Japanese Patent Application No. 2006-125208 filed on Apr. 28, 2006 including specification, claims, drawings and abstract is incorporated herein by reference in its entirety.

What is claimed is:

1. An image sensor comprising:
   a light source that irradiates a light on an object;
   a lens body that converges a reflection of the light from the object;
   a plurality of IC chips that receive the reflection passed through the lens body; and
   a transparent member provided between the IC chips and the lens body and formed continuously over the plurality of IC chips,
   wherein the transparent member includes a refractive index changing region having a mountain shape or an arc shape, which is provided at a portion opposite to a gap between adjacent IC chips, and
   a refractive index in the refractive index changing region increases continuously inward toward an inner body of the transparent member in a direction perpendicular to a plane that passes through the plurality of chips so that the refractive index changing region refracts a part of the reflection to be incident into the gap to the IC chips.

2. The image sensor according to claim 1, wherein the refractive index changing region includes a plurality of refractive index changing regions formed in a direction perpendicular to a longitudinal direction of the transparent member and are formed so as to be shifted to each other in the longitudinal direction.

3. The image sensor according to claim 1, wherein the refractive index in the refractive index changing region decreases toward a center thereof in a plane parallel to the plane that passes through the plurality of chips.

4. The image sensor according to claim 1, wherein the transparent member has a plate shape having a first flat surface facing the plurality of IC chips and a second flat surface opposite to the first flat surface.

5. The image sensor according to claim 1, wherein the transparent member includes a plurality of the refractive index changing regions which are arranged at an equal interval with each other.

\* \* \* \* \*